US008741380B2

(12) United States Patent
Yoshida et al.

(10) Patent No.: US 8,741,380 B2
(45) Date of Patent: Jun. 3, 2014

(54) FINE METAL STRUCTURE, PROCESS FOR PRODUCING THE SAME, FINE METAL MOLD AND DEVICE

(75) Inventors: Hiroshi Yoshida, Mito (JP); Haruo Akahoshi, Hitachi (JP); Akihiro Miyauchi, Hitachi (JP); Masahiko Ogino, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 812 days.

(21) Appl. No.: 12/859,802

(22) Filed: Aug. 20, 2010

(65) Prior Publication Data
US 2010/0310773 A1 Dec. 9, 2010

Related U.S. Application Data

(63) Continuation of application No. 10/584,139, filed as application No. PCT/JP2004/019116 on Dec. 21, 2004, now abandoned.

(30) Foreign Application Priority Data

Dec. 26, 2003 (JP) ................ 2003-431801

(51) Int. Cl.
*A61M 5/00* (2006.01)
*A61M 5/32* (2006.01)

(52) U.S. Cl.
USPC ........... 427/2.28; 427/2.1; 604/173; 604/272; 977/924

(58) Field of Classification Search
USPC ................ 604/173, 272
See application file for complete search history.

(56) References Cited

U.S. PATENT DOCUMENTS 5,342,737 A * 8/1994 Georger et al. ........... 430/324
6,521,285 B1 * 2/2003 Biebuyck et al. ......... 216/13

(Continued)

FOREIGN PATENT DOCUMENTS

JP 58-217689 12/1983
JP 6-29246 2/1994

(Continued)

OTHER PUBLICATIONS

Micromachine Technology Comprehensive List, edited by Micromachine Technology Comprehensive List Editorial Board and published by Industrial Technology Service Co., Jan. 22, 2003, pp. 365-371 and 700-702.

(Continued)

*Primary Examiner* — Cachet Sellman
(74) *Attorney, Agent, or Firm* — Antonelli, Terry, Stout & Kraus, LLP.

(57) ABSTRACT

A fine metal structure having its surface furnished with microprojections of high strength, high precision and large aspect ratio; and a process for producing the fine metal structure free of defects. There is provided a fine metal structure having its surface furnished with microprojections, characterized in that the microprojections have a minimum thickness or minimum diameter ranging from 10 nanometers to 10 micrometers and that the ratio between minimum thickness or minimum diameter (D) of microprojections and height of microprojections (H), H/D, is greater than 1. There is further provided a process for producing a fine metal structure, characterized by comprising providing a substrate having a fine rugged pattern on its surface, applying a molecular electroless plating catalyst to the surface, thereafter carrying out electroless plating to thereby form a metal layer having the rugged pattern filled, and detaching the metal layer from the substrate to thereby obtain a fine metal structure furnished with a surface having undergone reversal transfer of the above rugged pattern.

9 Claims, 12 Drawing Sheets

(56) References Cited

U.S. PATENT DOCUMENTS 6,749,731 B2    6/2004   Kobori
6,916,614 B1 *   7/2005   Takenaka et al. ............ 435/6.11

FOREIGN PATENT DOCUMENTS

| | | |
|---|---|---|
| JP | 2633088 | 4/1997 |
| JP | 2001-29761 | 2/2001 |
| JP | 2001-242135 | 9/2001 |
| JP | 2002-219587 | 8/2002 |
| JP | 2002-307398 | 10/2002 |
| JP | 2003-22585 | 1/2003 |
| JP | 2004-270021 | 9/2004 |

OTHER PUBLICATIONS

English translation of Japanese Office Action of Appln. 2003-431801 dated Jul. 28, 2009.
Japanese Office Action 2003-431801 mailed Nov. 4, 2009 with translation.

* cited by examiner (a)

(b)

(c)

(a)

(b)

(a)

(b)

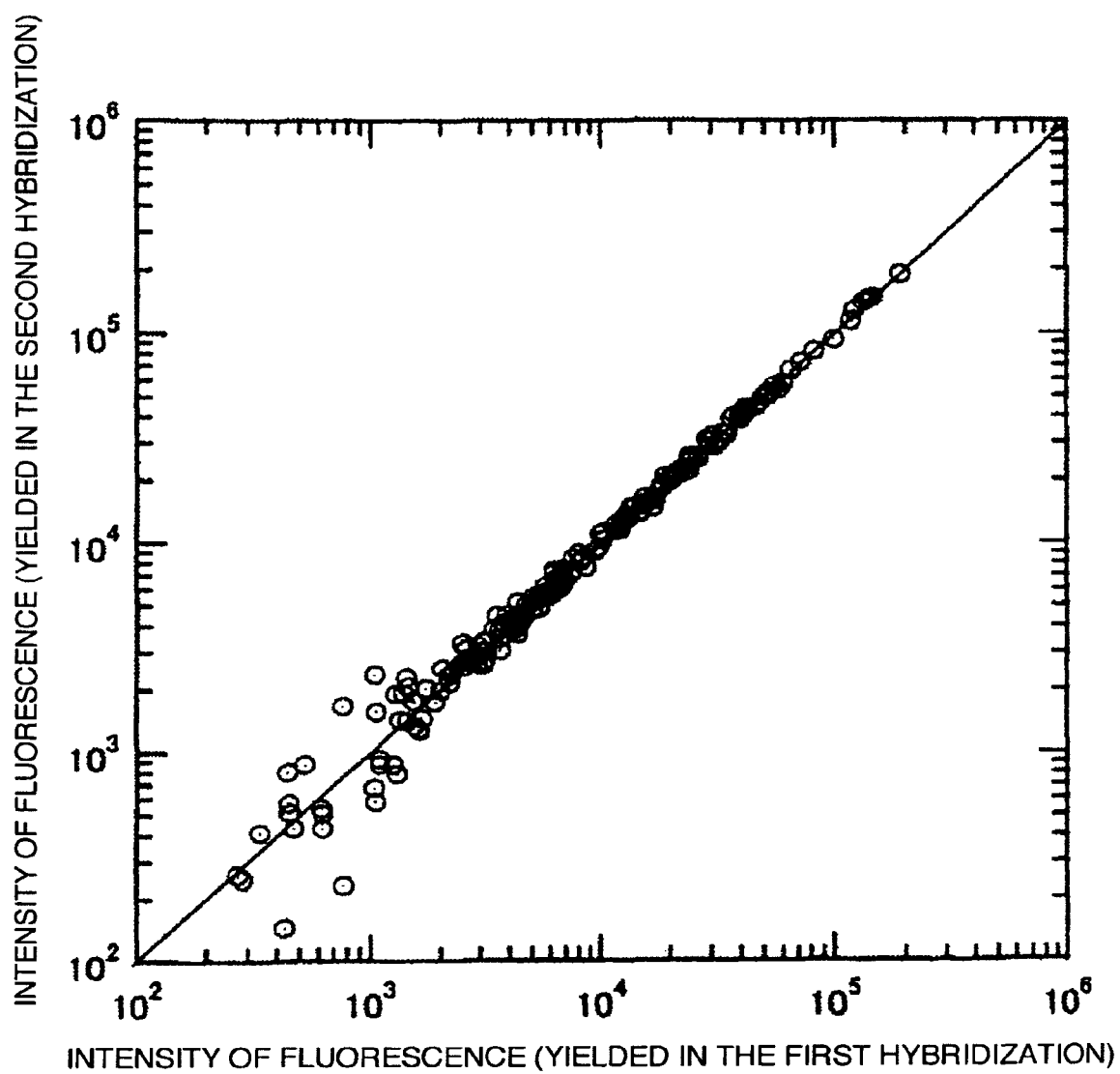

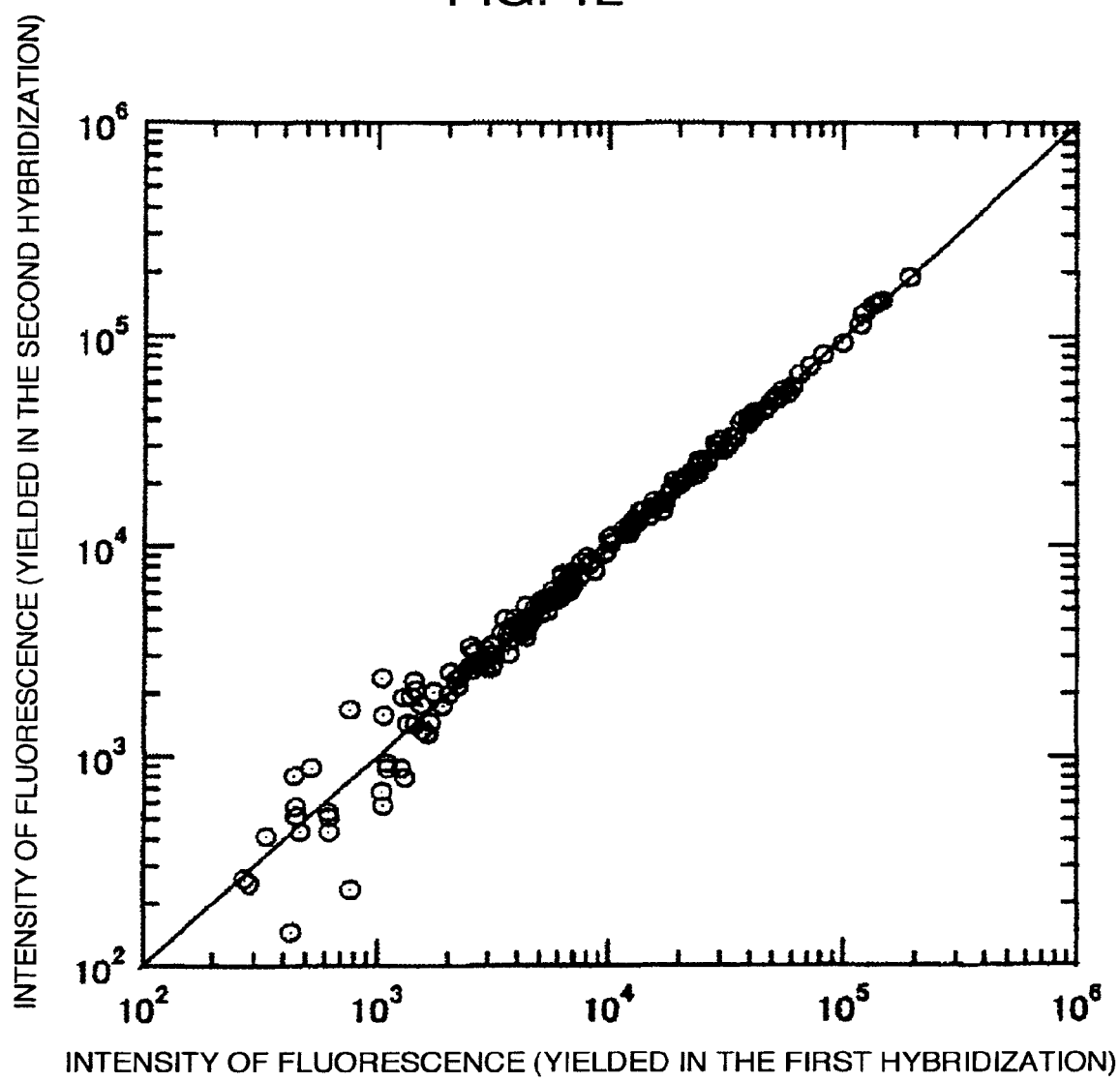

FINE METAL STRUCTURE, PROCESS FOR PRODUCING THE SAME, FINE METAL MOLD AND DEVICE

CROSS-REFERENCE TO RELATED APPLICATION

This application is a continuation application of U.S. application Ser. No. 10/584,139, filed Jun. 26, 2006, now abandoned, the contents of which are incorporated herein by reference.

TECHNICAL FIELD

The present invention relates to a fine structure having its surface furnished with microprojections and a process for producing such a structure. The present invention also pertains to the apparatuses and devices using the said fine structure, particularly fine metal molds and nanoimprinters used for nanoimprinting in which resins or inorganic materials are pressure molded, and electrodes, microchips and DNA chips for converting, producing or detecting the materials by making use of an electrochemical reaction.

BACKGROUND ART

The conventional fine structures having microprojections on their surfaces and methods of producing such structures are reviewed below.

In a first instance of the conventional fine structures having microprojections on the surface and their production methods, an inorganic material such as silicon, a metal such as nickel or an organic material such as polystyrene or resist is directly worked by a fine working technique such as lithography or anisotropic etching using a mask, and the obtained work is directly used as a structural member of a metal mold or microdevice. (See Patent Document 1).

In a second instance of the conventional fine structures having microprojections on the surface and their production methods, a resin such as polystyrene is pressure molded by using as its mold a fine structure obtained in the same way as in the first instance described above, and the molded product is detached from the mold and utilized as a fine structure. (See Patent Document 2).

In a third instance of the conventional fine structures having microprojections on the surface and their production methods, a fine structure obtained in the same way as in the first instance described above is used as a casting mold, the inside thereof is filled up by electroplating, and the formed plating film is detached from the mold and utilized as a fine structure. (See Patent Document 3).

With reference to the third instance, it is disclosed that in case a high hardness is required for the stamper surface, the stamper is made by electroless plating with NiP alone and the obtained stamper is heat treated at around 400° C. for 4 hours, whereby it is possible to obtain a HV hardness of 1,000 or higher. (See Patent Document 4).

Patent Document 1: JP-A-2002-307398
Patent Document 2: U.S. Pat. No. 5,772,905
Patent Document 3: Japanese Patent No. 2633088
Patent Document 4: JP-A-2003-22585 (paragraph [0040])

DISCLOSURE OF INVENTION

Problem to be Solved by the Invention

The fine structure obtained by the method described in Patent Document 1 is generally of high precision and may have sufficient strength when a metal or silicon is used for the structure. According to this method, however, since the structure is formed directly by fine working which requires a number of steps, the production cost is high and it is hard to apply this method to a process for mass producing the uncostly structure.

The method disclosed in Patent Document 2 is generally called nanoimprinting technology, with which it is possible to produce an object having fine structure by replicating, at low cost, the configuration of the fine structure formed by the first instance method. In this method, however, since the fine structure is produced by pressure molding, the materials usable for the fine structure are limited to those having relatively low strength, so that there is a fear of insufficiency of strength and reliability of the obtained fine structure. Further, when the molded product is released from the mold, the molded product may be deformed, posing the problem on precision of the obtained fine structure.

The method described in Patent Document 3 is a technique called electroforming, which is applied for producing the stamper used for producing digital videodiscs. According to this method, for forming the microprojections with a large aspect ratio, it is necessary to fill up the inside of the mold having a fine and deep hole or trench-like cavity by electroplating. It is, however, difficult to perfectly fill up the fine and deep hole or trench-like cavity without creating defects such as voids or seams in the central portion of the cavity. Further, since the metal articles obtained by electroplating are generally low in strength, this method not only involves a problem on reliability of the obtained fine structure but also has a possibility that when the plating film is detached from the mold after forming the microprojections with a large aspect ratio, the formed microprojections may be damaged.

Patent Document 4 describes a method with which it is possible to increase hardness of the structure, but it gives no concrete disclosure on the techniques for perfectly filling up the fine and deep cavity without forming defects such as voids or seams in the inside of the mold.

As viewed above, it is difficult with the prior art to provide a fine metal structure having on its surface microprojections of high strength, high precision and large aspect ratio, and a method of producing such a fine structure free of defects.

An object of the present invention is to provide a fine metal structure having its surface furnished with microprojections of high strength, high precision and large aspect ratio, and a process for producing such a fine structure free of defects.

Another object of the present invention is to provide the apparatuses and devices with high precision and high reliability, particularly fine metal molds and nanoimprinters used for nanoimprinting in which a resin or an inorganic material is pressure molded, and electrodes, microchips and DNA chips for converting, producing or defecting the materials by means of an electrochemical reaction.

Means for Solving the Problem

The present invention has been made for solving the above problem, and it provides a fine metal structure having its surface furnished with microprojections, characterized in that the microprojections have a thickness or an eqauivalent diameter ranging from 10 nanometers to 10 micrometers and an aspect ratio of greater than 1. The "aspect ratio" referred to herein is a value defined by the ratio (H/D) of the thickness or equivalent diameter (D) of the microprojections to their height (H). The term "equivalent diameter" is used here because the cross section of the microprojections is not always circular but may be oval, polygonal, asymmetric or of other shapes. In the present invention, this term is used for embracing all of these variety of sectional shape of microprojections. Also, in the present invention, "thickness of microprojections" means the length of the portion smaller in thickness in case the cross section of microprojections is of an elongated shape such as rectangular. It is also a feature of the present invention that the microprojections are made of an alloy having a nonmetallic element as an accessory constituent.

The fine metal structure of the present invention is also characterized by its production process in which a molecular electroless plating catalyst is applied to the surface of a substrate having a fine rugged pattern, then electroless plating is carried out to form a metal layer, and this metal layer is detached from the substrate to effect reversal transfer of the rugged pattern.

In an embodiment of the present invention, for suiting the intended purpose of use of the structure, at least part of the surface of microprojections may be coated with at least one layer of coating. Also, at least one kind of organic material selected from the surface modifiers such as antigens, antibodies, proteins, bases, sugar chains and release agents may be directly or indirectly fixed to the surface of microprojections.

Further, the process for producing a fine metal structure according to the present invention is characterized in that a molecular electroless plating catalyst is applied to the substrate surface having a fine rugged pattern, then electroless plating is carried out to form a metal layer having at least the said rugged pattern filled, and the metal layer is detached from the substrate to obtain a fine metal structure furnished with a surface having undergone reversal transfer of the said rugged pattern.

Other objects, features and advantages of the present invention will become apparent from perusing the following description of the embodiments of the invention given in conjunction with the accompanying drawings.

Advantages of the Invention

According to the present invention, it is possible to provide a fine metal structure having its surface furnished with microprojections of high strength, high precision and large aspect ratio, and a process for producing such a fine metal structure free of defects. It also becomes possible to provide high-precision and high-reliability apparatuses or devices using the said fine structure, particularly fine metal molds and nanoimprinters used for nanoimprinting in which a resin or an inorganic material is pressure molded, and electrodes, microchips and DNA chips for converting, producing or detecting the materials by an electrochemical reaction.

BEST MODE FOR CARRYING OUT THE INVENTION

As a result of extensive studies for solving the above problem, the present inventors have succeeded in inventing a fine metal structure having its surface furnished with microprojections made of a metal alloy containing a nonmetallic element as an accessory constituent. The present inventors have also found that by a process comprising applying a molecular electroless plating catalyst to the surface of a substrate having a fine rugged pattern, then carrying out electroless plating to form a metal layer having the rugged pattern filled, and detaching the metal layer from the substrate to thereby produce, free of defects, a fine metal structure furnished with a surface having undergone reversal transfer of the said rugged pattern.

The present inventors have also realized a high-strength, high-durability and high-precision fine metal mold for nanoimprinting and a nanoimprinter by making use of the said fine metal structure and its production process described above. Moreover, the present inventors have completed a high-performance electrode, microchip and DNA chip by coating the surface of the said fine metal structure with a layer of an organic material, an inorganic material or a metal. Particularly, the present inventors have found that it is possible to fix a substance derived from an organism, especially an antigen, antibody, protein, base or sugar chain, on the surface of a metal coating formed on the surface of the said fine metal structure. The present inventors have also found that by applying this finding to microchips, it is possible to mass produce various kinds of devices with excellent durability at low cost. The present invention has been attained on the basis of the above disclosures.

FIG. 1 is a schematic perspective illustration of a fine metal structure having microprojections on the surface, completed in accordance with the present invention. In the present invention, the microprojections have the various shapes such as cylindrical (101), rectangular column (102) and tabular (103). In the fine metal structure, these microprojections, either of a single configuration or with two or more different configurations, are provided on the surface of a substrate 104 in an orderly or distributed arrangement. The fine metal structures provided according to the present invention are not limited to those having microprojections on the surface but also include those having fine holes, fine trenches or other like cavities in the substrate surface and those in which the microprojections and fine cavities (holes, trenches or the like) are present in a mingled state. The fine metal structure obtained according to the present invention can be applied to uses for physically or chemically adsorbing or sorting microparticles or organism-derived molecules. It can also be used for optical devices by applying the photonic band gap phenomenon or the principles of scattering, refraction, electron release, etc. Further, since the fine structure of the present invention has a very large surface area in comparison with the structures having a flat surface, this structure can be applied as a substrate for high-sensitivity electrodes or DNA chips. In view of the above, the microprojections in the present invention preferably have a minimum thickness or minimum diameter of from 10 nanometers to 10 micrometers. It is also preferable that the ratio of the minimum thickness or minimum diameter (D) of the microprojections to the height (H) thereof, H/D, is greater than 1.

We have found that a fine metal structure having microprojections of high strength and large aspect ratio on the surface can be obtained by using as its material a metal alloy containing a nonmetallic element, especially phosphorus or boron, as an accessary constituent. The metal alloys usable for the structure needn't be specific types although nickel-phosphorus alloy or nickel-boron alloy comprising nickel as its major component is preferable for high strength; it is possible to use alloys comprising cobalt or, other metals as major component or those composed of two or more types of metal. These alloys are generally higher in strength than pure metals composed of only one metal. This is considered attributable to segregation of the nonmetallic element such as phosphorus or boron in the alloys. We have found that this segregation is particularly effective in a fine structure and this finding has contributed to the attainment of the present invention. The reason therefor is not clarified at this writing, but it is considered that one account is the fact that the makeup of segregation of the nonmetallic element in a fine structure is different from that in the bulk. The concentration of a nonmetallic element contained in a metal alloy is not specified, but generally it is preferable, in terms of strength of the obtained fine metal structure, that the concentration of the nonmetallic element is in the range of 2% by weight to 15% by weight in the case of phosphorus and 0.1% by weight to 8% by weight in the case of boron. When the concentration of the nonmetallic element is below the above-defined range, there is produced no satisfactory strength improving effect. On the other hand, when the concentration of the nonmetallic element exceeds the above range, the obtained fine metal structure proves to be so embrittled that it can hardly be offered to practical use.

As viewed above, a fine structure made of a metal alloy containing a nonmetallic element, especially phosphorus or boron, as an accessory constituent shows high strength, and particularly excellent properties are provided when the microprojections present on the surface of the fine metal structure are cylindrical or rectangular column shaped ones, and the ratio of diameter or length (D) of one side of such shaped microprojection to its height (H), H/D, is greater than 1, that is, when fine and high microprojections are built up on the substrate. Generally, when these fine and high microprojections were made of a resin or a metal, their strength was low, and when, for instance, the obtained fine metal structure was used as a fine metal mold for nanoimprinting, it would be broken in several times of use. Also, in use of the fine structure as a substrate for DNA chips, damage to the microprojections on the surface of the fine structure was observed during spotting of the DNA solution. However, when the present invention was applied for these structures, the frequency of occurrence of said troubles was drastically lessened.

Next, a process for flawlessly producing a fine metal structure furnished with microprojections on the surface is explained with reference to FIG. 2. According to this process, a molecular electroless plating catalyst is applied to the surface of a fine mold having a fine rugged pattern to form a molecular electroless plating catalyst layer 202, then said mold 201 is dipped in an electroless plating solution to perfectly fill up the ruggedness present on the mold surface with an electroless plating film 203, and then the electroless plating film 203 is detached from the fine mold 201 to thereby obtain a fine metal structure furnished with a surface having undergone reversal transfer of the rugged pattern. By applying this process, it is possible to mass produce, free of defects, the fine metal structures having microprojections of high strength, high precision and large aspect ratio on the surface. When detaching the plating film 203 from the fine mold 201, although the plating film 203 itself may be separated, it is preferable to laminate a support layer 204 on the backside of the plating film for the purpose of improving strength of the plating film 203 and simplifying the treatment. The material of the support layer 204 is not specified; it is possible to use, for instance, metals such as nickel and copper, glass, inorganic materials such as titanium oxide, and organic materials such as polystyrene and polyethylene terephthalate. Various methods are available for forming the support layer 204, such as electroplating, sputtering, sol-gel method and solvent casting, which may be properly selected according to the material used for the support film. FIG. 2(e) depicts a situation where when the plating film 203 is detached from the mold 201, the molecular electroless plating catalyst layer is also separated from the mold 201 with the plating film 203. However, when the plating film is detached, a part or whole of the molecular electroless plating catalyst layer 202 may remain on the surface of the fine mold 201 so that there may be a portion where the surface of the electroless plating film 203 after detachment is not coated with the molecular electroless plating catalyst layer.

By application of this process, it is possible to precipitate the nonmetallic element such as phosphorus or boron by properly selecting the reducing agent and/or additives used for electroless plating, which makes it possible to produce a high-strength fine metal structure. This is an outstanding feature of the present process, which greatly contributes to solving the problems in the conventional electroforming operations. As the major component of the electroless plating film, nickel, gold, silver, platinum, palladium, cobalt, tin and copper may be cited as examples. Although the major component is not specified, nickel is preferred in view of strength of the obtained fine structure.

Another feature of the process creditable to this invention is that it is capable of easily producing the microprojections of a shape with a large aspect ratio, which have been generally difficult to produce with the conventional electroforming method. For forming the microprojections with a shape of large aspect ratio, it needs to let a metal precipitate in the mold having a deep cavity to fill it up. In this operation, there exist the following two problems with the electroforming method, which makes it difficult to produce a fine structure of high quality. The first problem is that in the electroforming method, in order to fill the inside of the mold by electroplating, it is necessary to form an electrical feeder layer on the fine mold surface prior to electroplating. Generally, such technique as sputtering or vapor deposition is applied for forming the feeder layer, but it is difficult to form this feeder layer uniformly in a fine metal mold having a deep cavity. Another problem concerns the fact that when using an electroplating method, precipitation of the plating film takes place earlier in the vicinity of the surface portion of the cavity than in the area around the bottom portion of the cavity, and consequently, the cavity is closed by the plating film which precipitated in the vicinity of the surface portion of the cavity before the inside of the cavity is perfectly filled. As a result, voids and/or seams are formed in the inside of the produced microprojections, making it unable to obtain a fine metal structure with high quality.

In order to solve the above problems, we have pursued studies for filling the inside of the cavity by an electroless plating method which is considered to have an advantage of allowing uniform growth of the plating film. As a result, we have found that only when using a molecular electroless plating catalyst with its atoms dissolved in a solution in the state of a complex or a salt, instead of using a conventional colloidal catalyst, as the catalyst serving as a starting point of the electroless plating reaction, it is possible to fill the cavity free of defects and to produce a fine metal structure of large aspect ratio with high precision. The present invention is based on this finding.

The cause of the above phenomenon, as surmised from the viewpoint of the process of growth of plating with the catalyst applied to the cavity serving as cardinal point, is explained with reference to FIG. 3. FIG. 3(a) is a schematic enlarged view of the hollow portion 302 of a fine mold to which the colloidal catalyst particles 301 have been applied by dipping the substrate having fine ruggedness on the surface in a commonly used colloidal electroless plating catalyst solution. The colloidal catalyst particles 301 are adsorbed on the surface of the hollow portion by physical or chemical adsorption. Needless to say, the colloidal catalyst particles 301 must be sufficiently smaller in diameter than the hollow space to which the catalyst is applied, but even when using the particles with a sufficiently small diameter, there is produced a situation where the catalyst particles are adsorbed sporadically on the inside of the hollow portion. When the fine mold is introduced into the electroless plating solution to start the reaction in this situation, the plating film 303 grows at a given precipitation speed centered on the colloidal catalyst particles 301 as schematically shown in FIG. 3(b). In some cases, therefore, the plating film which has grown centered on the catalyst may partly come into contact with each other to produce a clogged state of cavity as shown in FIG. 3(c) before the cavity is perfectly filled with the plating film. Such a phenomenon occurs briskly in case the cavity is deep and fine, giving rise to defects 304 such as voids or seams in the cavity.

On the other hand, when a molecular catalyst is used, there is formed a molecular catalyst layer 305 with the catalyst molecules being uniformly adsorbed in the cavity as shown in FIG. 3(d). Therefore, the plating film 303 which grows centered on the catalyst is allowed to grow uniformly almost parallel to the cavity surface as schematically shown in FIGS. 3(e) and 3(f), making it possible to fill a deep and fine cavity free of defects such as voids and seams, which is hardly possible when using a colloidal catalyst.

The fine metal structure of large aspect ratio obtained according to the present invention can be applied, for its strength, precision and configuration, to a wide variety of industrial products, devices, parts, etc., for example, various kinds of devices such as electrodes, DNA chips and immunoanalytical chips used for converting, producing or detecting the materials by the electrochemical reactions, optical devices such as MEMS, optical or magnetic storages, waveguides and diffraction gratings, photonic crystals, electron emission sources used for FED displays, etc. The above-described fine metal structure and its production process can be applied directly in the form as they are, but more preferably, the structure is applied after coating its surface with an organic material, an inorganic material or a metal according to the purpose of use of the structure. The organic material, inorganic material or metal used for such coating is not specified, but it is expedient to properly select one suited for the purpose of use of the structure, for example, gold, silver or a platinum group metal may be selected when the structure is used as an electrode or the like, while a fluorine-based release agent is recommended when the structure is used as a fine metal mold.

In application of the fine structure of the present invention to microchips or sensors used for detection or separation of organic molecules or trace chemical substances, it is advised to make the coating with the organic molecules or organism-derived molecules, such as antigens, antibodies, proteins, bases or sugar chains, which interact with the object material of detection or separation. In this case, the organic molecules or organism-derived molecules may be coated directly on the structure surface by a suitable method such as physical adsorption, but preferably they are fixed by chemical bonding. Such chemical fixation of the organic molecules or organism-derived molecules on the structure surface can be effected by, for instance, silane coupling or gold-thiol bonding. The latter is preferred as it allows easier fixation of the organic molecules or organism-derived molecules. Thus, according to the present invention, it becomes possible to introduce, with stability, the organic molecules or organism-derived substances to the surface of a fine structure by coating the structure surface with gold and then reacting the gold coating with the organic molecules or organism-derived substances to which thiol groups have been introduced. For coating the structure surface with gold, immersion plating method is preferably used as it allows simple coating operation.

The detailed modes of practice of the present invention are described below with reference to the examples thereof.

EXAMPLE 1

Fine Nickel-Phosphorus Alloy Structure

As an embodiment of the present invention, a fine metal structure mostly composed of nickel and containing phosphorus as an accessory constituent is explained. FIG. 4 is a schematic illustration, based on a scanning electron microphotograph, of the surface portion of a fine metal structure mostly composed of nickel and containing phosphorus as an accessory constituent, which was produced in the instant embodiment of the invention. This fine metal structure comprises a plurality of cylindrical microprojections 401 mostly composed of nickel and containing phosphorus as an accessory constituent, and a metallic film 402. The cylindrical microprojections 401 and metallic film 402 are integral to each other and made of a nickel-phosphorus alloy of the same composition. On the backside of the metallic film 402, although not shown in FIG. 4, is a polystyrene layer with a thickness of 50 micrometers for supporting the fine metal structure. The height of said cylindrical microprojections 401 is 2 micrometers and their diameter is 240 nanometers at the bottom and 220 nanometers at the top end. The ratio of the minimum diameter (D) to the height (H) of the microprojections, viz. the aspect ratio (H/D) thereof is as great as 9.1. The center-to-center distance between the adjoining microprojections is 480 nanometers.

The above fine metal structure was made by the following method. FIG. 5 shows a production process of a fine metal structure. First, a resist layer 502 was formed on the surface of a silicon wafer substrate 501 having crystal orientation of (100) and a diameter of 100 mm, and then a pertinent mask pattern 503 was formed by electron beam lithography, followed by dry etching of the silicon wafer substrate to make a fine mold 504 having a reversed surface configuration of the fine metal structure. The method of forming the pattern on the substrate is not specifically defined; a proper method may be selected according to the desired work precision, for example, photolithography may be employed instead of electron beam lithography. Also, etching of the substrate may be accomplished not only by dry etching but also by applying other techniques such as wet etching using an etching solution. As the substrate material, there can be used the materials having sufficient strength and workability with required precision, such as silicon wafer, various kinds of metallic material, glass, ceramic and plastic materials. Specifically, Si, SiC, SiN, polycrystalline Si, glass, Ni, Cr, Cu, and the materials containing at least one of these elements can be cited as preferred examples.

Then a molecular electroless plating catalyst layer 505 was formed on the surface of the fine mold 504 by the following method. First, the fine mold 504 was cleaned by immersing it in a mixed solution of sulfuric acid and hydrogen peroxide solution (70%/30%) at 70° C. for 30 minutes. This mold was sufficiently washed with pure water and then further immersed in a cleaner solution (Securigant 902 produced by Atotec Japan) for expediting application of the catalyst, at 30° C. for 5 minutes to adjust the mold surface. The thus treated mold 502 was washed well with pure water and then dipped in a predipping solution (Neogant B produced by Atotec Japan) at room temperature for one minute for the purpose of preventing contamination of the catalyst solution. The mold was then dipped in a catalyst solution (Neogant 834 produced by Atotec Japan) at 50° C. for 5 minutes to afford palladium to the mold surface. The catalyst used here was the type prepared by dissolving the palladium complex molecules in a solution. After applying the catalyst, the mold was washed by dipping it in pure water, and the palladium applied by using a Neogant W solution (Atotec Japan) was activated as nucleus. Lastly, the thus worked mold 504 was washed with pure water to obtain a fine mold 504 having a molecular catalyst layer 505. Although a palladium type catalyst produced by Atotec Japan was applied in this example, the catalyst usable here is not limited to this type but all the other types of molecular catalysts can be used.

The catalyst-applied fine mold 504 was dipped in an electroless plating solution to deposit an alloy film 506 mostly composed of nickel on the inside of the fine cavity and on the mold surface. The composition of the electroless plating solution used here and the plating conditions are shown in Table 1. In this example, sodium phosphate was used as reducing agent for the purpose of coprecipitating phosphorus as an accessory constituent of the alloy.

TABLE 1

Composition of electroless nickel plating solution and plating conditions

| | |
|---|---|
| Nickel chloride | 20 g · dm$^{-3}$ |
| Sodium hypophosphite | 20 g · dm$^{-3}$ |
| Ammonium chloride | 35 g · dm$^{-3}$ |
| Sodium citrate | 10 g · dm$^{-3}$ |
| Plating temperature | 80° C. |
| Plating solution pH | 8.5 |
| Plating time | 60 min. |

The surface of the electroless plating film 506 was coated with a polystyrene solution (concentration: 5 wt %) by a bar coater and dried at 70° C. by a dryer to form a polystyrene support film 507.

Lastly, the electroless plating film 506 supported by the polystyrene film 507 was detached from the fine mold 504 to obtain a fine metal structure mostly composed of nickel and containing phosphorus as an accessory constituent. Fluorescent X-ray analysis of the constituents of the obtained fine metal structure showed that the content of the accessory constituent phosphorus was 4.5% by weight. Also, minute observation of the surface of the obtained fine nickel alloy structure by a scanning electron microscope confirmed that the cylindrical microprojections on the surface of the fine nickel alloy structure could be formed free of defects. Further, the cylindrical microprojections were cut at intervals of 100 nm from the top end by convergent ion beam machining and the cut cross sections were observed by a scanning electron microscope, which confirmed that there were no flaws such as seams or voids in the inside of the cylindrical microprojectioins.

Next, a fine metal structure was produced on an experimental basis according to the same process as described above except that a colloidal electroless plating catalyst HS202B (produced by Hitachi Chemical Industries Co., Ltd.) was used in place of the molecular electroless plating catalyst. Close observation of the surface of the produced fine nickel alloy structure by a scanning electron microscope revealed partial imperfections of the cylindrical microprojections on the surface of the fine nickel alloy structure. The cylindrical microprojections were cut at intervals of 100 nm from the top end by convergent ion beam machining, and the cut sections were observed by a scanning electron microscope, which revealed the presence of many defects such as seams and voids in the inside of the cylindrical microprojections. From the above, it was clarified that a flawless fine metal structure can be produced only when a molecular electroless plating catalyst is applied.

EXAMPLE 2

Nickel-Boron Alloy Structure

A fine metal structure made of a nickel-boron alloy having the same makeup as the fine metal structure of Example 1 was made from the same process as in Example 1 except that the electroless plating solution and the plating conditions were changed as shown in Table 2.

TABLE 2

Composition of electroless nickel plating solution

| | |
|---|---|
| Nickel sulfate | 30 g · dm$^{-3}$ |
| Dimethylamineborane | 3.4 g · dm$^{-3}$ |
| Ammonium chloride | 30 g · dm$^{-3}$ |
| Sodium succinate | 55 g · dm$^{-3}$ |
| Boric acid | 30 g · dm$^{-3}$ |
| Plating temperature | 60° C. |
| Plating solution pH | 6.0 |
| Plating time | 60 min. |

Fluorescent X-ray analysis of the composition of the obtained fine metal structure showed that the content of the accessory constituent boron was 3.0% by weight. It was also confirmed that the cylindrical and tabular microprojections on the surface of the obtained fine nickel alloy structure could be formed free of defects. The cylindrical and tubular microprojections were cut at intervals of 100 nm from the top end by convergent ion beam machining and the cut sections were observed by a scanning electron microscope, which confirmed that there existed no defects such as seams or voids in the inside of both cylindrical and tabular microprojections.

A fine metal structure was made as a trial product according to the same process as in Example 1 except that a colloidal electroless plating catalyst HS202B (produced by Hitachi Chemical Industries Co., Ltd.) was used in place of the molecular electroless plating catalyst. Close observation of the surface of the obtained fine metal structure by a scanning electron microscope detected partial defects on the cylindrical microprojections on the surface of the fine nickel alloy structure. Also, the cylindrical microprojections were cut at intervals of 100 nm from the top end by convergent ion beam machining, and the cut sections were observed by a scanning electron microscope, which revealed the presence of defects such as lots of seams and voids in the inside of the cylindrical microprojections. From the above, it has become evident that a flawless fine metal structure can be produced only when a molecular electroless plating catalyst is applied.

EXAMPLE 3

Cobalt-Phosphorus Alloy Structure

A fine metal structure comprising a cobalt-phosphorus alloy and having the same makeup as the structure of Example 1 was made according to the same process as in Example 1 except for use of the electroless plating solution and the plating conditions shown in Table 3.

TABLE 3

| Composition of the electroless cobalt plating solution | |
|---|---|
| Cobalt sulfate | $5.0 \times 10^{-2}$ mol·dm$^{-3}$ |
| Sodium hypophosphite | $2.0 \times 10^{-1}$ mol·dm$^{-3}$ |
| Sodium succinate | $5.0 \times 10^{-1}$ mol·dm$^{-3}$ |
| Boric acid | $5.0 \times 10^{-1}$ mol·dm$^{-3}$ |
| Plating temperature | 60° C. |
| Plating solution pH | 10.0 |
| Plating time | 90 min. |

Fluorescent X-ray analysis of the constituents of the obtained fine metal structure showed that the content of the accessory constituent phosphorus was 5.2% by weight. Also, close observation of the surface of the produced fine cobalt alloy structure confirmed that the cylindrical and tabular microprojections on the surface of said structure could be formed free of defects. The cylindrical and tabular microprojections were cut at intervals of 100 nm from the top end by convergent ion beam machining, and the cut sections were observed by a scanning electron microscope, which confirmed that there existed no defects such as seams or voids in the inside of both cylindrical and tabular microprojections.

A fine metal structure was made as a trial product according to the same process as in Example 1 except that a colloidal electroless plating catalyst HS202B (produced by Hitachi Chemical Industries Co., Ltd.) was used in place of the molecular electroless plating catalyst. Close observation of the surface of the obtained fine metal structure by a scanning electron microscope confirmed partial defects on the cylindrical microprojections on the surface of the fine cobalt alloy structure. Also, the cylindrical microprojections were cut at intervals of 100 nm from the top end by convergent ion beam machining, and the cut sections were observed by a scanning electron microscope, which revealed the presence of defects such as lots of seams and voids in the inside of the cylindrical microprojections. From the above, it has become evident that a flawless fine metal structure can be produced only when a molecular electroless plating catalyst is applied.

EXAMPLE 4

Palladium-Phosphorus Alloy Structure

A fine metal structure comprising a cobalt-phosphorus alloy and having the same makeup as the structure of Example 1 was made according to the same process as Example 1 except for use of the electroless plating solution and the plating conditions shown in Table 4.

TABLE 4

| Composition of the electroless palladium plating solution | |
|---|---|
| Palladium chloride | $1.0 \times 10^{-2}$ mol·dm$^{-3}$ |
| Sodium hypophosphite | $6.0 \times 10^{-2}$ mol·dm$^{-3}$ |
| Ethylenediamine | $8.0 \times 10^{-2}$ mol·dm$^{-3}$ |
| Thioglycollic acid | $1.6 \times 10^{-4}$ mol·dm$^{-3}$ |
| Plating temperature | 50° C. |
| Plating solution pH | 6.5 |
| Plating time | 90 min. |

Fluorescent X-ray analysis of the constituents of the obtained fine metal structure showed that the content of the accessory constituent phosphorus was 4.1% by weight. Also, close observation of the surface of the produced fine palladium alloy structure confirmed that the cylindrical and tabular microprojections on the surface of said structure could be formed free of defects. The cylindrical and tabular microprojections were cut at intervals of 100 nm from the top end by convergent ion beam machining, and the cut sections were observed by a scanning electron microscope, which confirmed that there existed no defects such as seams or voids in the inside of both cylindrical and tabular microprojections.

A fine metal structure was made as a trial product according to the same process as in Example 1 except that a colloidal electroless plating catalyst HS202B (produced by Hitachi Chemical Industries Co., Ltd.) was used in place of the molecular electroless plating catalyst. Close observation of the surface of the obtained fine metal structure by a scanning electron microscope confirmed partial defects on the cylindrical microprojections on the surface of the fine palladium alloy structure. Also, the cylindrical microprojections were cut at intervals of 100 nm from the top end by convergent ion beam machining, and the cut sections were observed by a scanning electron microscope, which revealed the presence of defects such as lots of seams and voids in the inside of the cylindrical microprojections. From the above, it has become evident that a flawless fine metal structure can be produced only when a molecular electroless plating catalyst is applied.

EXAMPLE 5

Gold-Plated Fine Nickel-Boron Alloy Structure

Disclosed in this example is a fine metal structure having a gold surface. First, a fine nickel-boron alloy structure and a fine nickel-phosphorus alloy structure having the same makeup as the fine nickel-phosphorus alloy structure shown in FIG. 4 were produced by the methods shown in Example 1 and Example 2. Then these fine nickel alloy structures were dipped in an immersion gold plating solution Erial TMA (produced by Kamimura Kogyo KK) for 10 minutes to replace the nickel alloy surface with gold to thereby obtain a fine nickel-boron alloy structure and a fine nickel-phosphorus alloy structure both having a gold surface. In this operation, the plating temperature was set at 75° C. with pH adjusted to 7.2.

Both of the obtained structures had gold luster, and in observation thereof by a scanning electron microscope, there was observed no definite difference in construction before and after replacement gold plating in both structures.

EXAMPLE 6

Fine Electrode

This example concerns application of a fine metal structure having on its surface the nanopillars made of a gold-plated nickel-phosphorus alloy as a high-sensitivity electrode for anode stripping which is a technique for the analysis of trace metal ions.

The process used for producing a high-sensitivity gold electrode as a trial product in this example is schematically illustrated in FIG. 6. First, a gold-plated nickel-phosphorus alloy film 601 (10 mm×10 mm) having the cylindrical microprojections on the surface and supported by a polystyrene film was formed by the same method as used in Example 5. The dimensions of each cylindrical microprojection were 180 nanometers in diameter of the bottom portion, 160 nanometers in diameter of the top portion and 1 micrometer in height, and the pitch between the centers of the adjoining microprojections was 300 nanometers. Then this alloy film 601 was attached to a 15 mm×30 mm glass substrate 602, and a conductive copper tape 603 was pasted along the periphery of the alloy film 601 to form an electricity feed line. Then a manicure film was applied on the surface of the glass substrate and the surface of the gold-plated nickel-phosphorus alloy film, excluding the central portion (5 mm×5 mm) of the surface of the structure having the cylindrical microprojections to form a seal 604, thereby making a high-sensitivity gold electrode.

Using this high-sensitivity gold electrode, the trace copper ions contained in an aqueous solution were analyzed by anode stripping. Anode stripping is a method which comprises reduction concentrating the metal ions contained in a solution on the electrode, conducting anode polarization of the electrode to cause oxidative elution, and identifying the ions in the solution from electric potential or quantity of electricity flowing in the solution at that time. First, four kinds of copper sulfate solutions with copper ion concentrations of $1\times10^{-8}$ mol/l, $1\times10^{-9}$ mol/l, $1\times10^{-10}$ mol/l and $1\times10^{-11}$ mol/l, respectively, were prepared by using ultra-pure water. Then, each of the copper sulfate solutions was analyzed by anode stripping using the high-sensitivity gold electrode and a comparative electrode comprising a substrate having a flat gold surface made by depositing gold on the surface of a glass substrate. For the analysis, there were used a glass-made beaker, a platinum electrode for the opposite electrode, and a saturated calomel electrode for the reference electrode. 30 cc of each copper sulfate solution was supplied into the beaker and after dipping the gold electrode, opposite pole and reference electrode in the solution, the beaker was purged with argon gas. Then an electric potential of −0.4 V vs. SCE was applied to the electrode for 15 minutes to precipitate copper on the electrode surface, then the electrode potential was swept from −0.1 V vs. SCE to +1.0 V vs. SCE at a rate of 0.1 V/min to dissolve copper precipitated on the electrode surface, and the potential and electric current at that time were recorded. The obtained results are shown in Table 5. The ratio of the amount of copper dissolving charge observed with the electrode having microprojections to that observed with the electrode having no microjections was 10 to 15 regardless of the copper ion concentration, which indicates that it is possible to make determinations with higher precision and higher sensitivity by using the electrode having microprojections than capable when using the electrode having no microprojections. This is considered attributable to a drastic increase of the surface area of the electrode, resulting in an increase of the amount of copper precipitating on the electrode surface, due to formation of microprojections on the electrode surface, in comparison with the case where no microprojections are present on the electrode surface.

TABLE 5

Results of determination by anode stripping

| Copper ion concentration | Ratio of amount of copper dissolving charge observed with electrode having microprojections to that observed with electrode having no microprojections |
|---|---|
| $1 \times 10^{-8}$ mol·dm$^{-3}$ | 10.5 |
| $1 \times 10^{-9}$ mol·dm$^{-3}$ | 11.0 |
| $1 \times 10^{-10}$ mol·dm$^{-3}$ | 13.5 |
| $1 \times 10^{-11}$ mol·dm$^{-3}$ | 14.2 |

EXAMPLE 7

Nano-Mold

This example concerns application of a metal structure having microprojections made according to the present invention to a stamper for nano-imprinting. FIG. 7 is a schematic illustration of a stamper 701 made of a nickel-boron alloy produced on an experimental basis. The external size of the stamper was 6 inchesφ and its thickness was 100 micrometers. The stamper 701 comprises a nickel-boron alloy-made structure 702 having fine ruggedness on the surface and a support layer 703 formed by nickel electroplating. On the surface of the nickel-boron alloy-made structure 702 are formed cylindrical microprojections 704 and micro-hollows 705. Each of the microprojections 704 had a height of 1 micrometer and its diameter was 240 nanometers at the bottom portion and 220 nanometers at the top end. Each of the micro-hollows 705 had a diameter of 240 nanometers at the surface and 20 nanometers at the bottom and a depth of 1 micrometer. The center-to-center distance between the adjoining microprojections and between the adjoining micro-hollows was 360 nanometers.

The stamper 701 was made by the same method as used in Example 2. That is, a 6-inch silicon substrate was dry etched to make a mold having a reversed surface configuration of the nickel-boron alloy-made structure 702, and then a molecular electroless plating catalyst was applied to the mold surface, followed by electroless nickel-boron alloy plating to perfectly fill the surface ruggedness. Thereafter, nickel electroplating was applied to the backside of the nickel-boron alloy plating film to form a 90-micrometer thick nickel support layer 703. Lastly, the plating film was detached from the mold to obtain a stamper 701.

A nano-printer made on trial by using the above stamper is schematically shown in FIG. 8. FIG. 8(a) is an apparatus for forming a peel ply 720 on the rugged surface of the stamper 701, and FIG. 8(b) shows an apparatus for transferring fine ruggedness of the stamper 701 to the substrate. FIGS. 9(a) and (b) are the enlarged views of the portions of the apparatuses of FIGS. 8(a) and (b), respectively, located close to the surface of the stamper 701.

Here, the procedure of operations is explained. First, a process for coating the stamper 701 surface with a release agent 713 for facilitating release from the mold in the resin molding operation is explained with reference to FIG. 9. As shown in FIG. 9(a), a silicone-based (polydimethylsiloxane) release agent 713 was spin coated on a glass substrate 714 having a flat surface to a coating thickness of 200 nanometers. This release agent-applied substrate was placed on a stage 708 (FIG. 8(a)) and fixed by a vacuum chuck. Further placed thereon were the stamper 701 and a buffer 712 (5 inchesφ and 3 mm thick). The assembly was pressed by a pressing mechanism 710 under a pressure of 2 MPa to form a peel ply 720 on the stamper surface 701. Buffer 712 was used for conforming the stamper to the undulation of the substrate 714. It is possible to form peel ply 720 only on the surface of the rugged portion of the stamper 701 by making the thickness of release agent 713 smaller than the pattern depth of the stamper 701. Then the pressure was released and the stage was raised to obtain the stamper 701 having its surface coated with release agent 713.

Next, a process for molding a resin by using the stamper 701 coated with a release agent is explained. First, an Si substrate (6 inches φ and 0.5 mm thick) was coated with a resin 722 (Polystyrene 679 produced by A and M) to a coating thickness of 600 nm. After positioning a stamper 701 coated with a release agent, the assembly was set on a stage 718 (FIG. 8(b)). The fine structure transfer device shown in FIG. 8(b), unlike the peel ply forming device of FIG. 8(a), is provided with a vacuum chamber 717, and the stage 718 is equipped with a heating mechanism. The chamber was evacuated to 0.1 Torr or below and, after heated to 250° C., maintained under 12 MPa for 10 minutes to press the assembly. Then the assembly was allowed to cool down to 100° C. or below and released to the atmosphere. A peeling jig was attached securely to the backside of the stamper at room temperature and pulled up in the vertical direction at a rate of 0.1 mm/s, whereby the stamper surface configuration was transferred to the resin surface.

The above resin molding process was repeated 100 times using the stampers 701 coated with a same release agent to obtain 100 pieces of moldings to which the stamper surface configuration has been transferred. Then the stamper surface after 100 times of execution of the above process was closely examined by SEM. There was admitted no damage to the fine structure on the surface, and it was confirmed that the fine metal structure made according to the present invention has sufficient strength for use as a nano-mold.

EXAMPLE 8

Fluorine Molecule-Fixed Nano-Mold

This example describes a process for making a stamper which allows easy separation of the resin molding with no need of coating it with a release agent in nanoprinting by plating the surface of the fine metal structure with gold and covalent bonding the fluorine-containing molecules on its surface.

First, a nickel-boron alloy-made stamper having the same structure as that shown in FIG. 7 was made by the same method as used in Example 7. Then the stamper surface was subjected to replacement plating with gold by the method shown in Example 5 to form a gold deposit. Then this gold-plated stamper was dipped in an ethanol solution (concentration: $1.0 \times 10^{-4}$ mol/l) of 1H,1H,2H,2H-perfluorodecanethiol (produced by Apollo Science Ltd., U.K.) represented by the chemical structural formula shown below as Compound 1 to chemically bond the gold atoms on the stamper surface with the sulfur atoms of 1H,1H,2H,2H-perfluorodecanethiol to obtain a stamper having on its surface a layer in which Compound 1 has been closely fixed. The fluorine-containing molecule used in this example is not limited to Compound 1 but can be any compound having a thiol group bonded to the fluorocarbon chain.

$$CF_3\text{---}(CF_2)_7\text{---}(CH_2)_2\text{---}SH \qquad \text{(Compound 1)}$$

Using a stamper having a layer of Compound 1 on the surface, nanoimprinting of a polystyrene resin was repeated 100 times according to the same process as used in Example 7 except that the step of forming a peel ply was omitted. In all the nanoimprinting operations, the stamper could be easily detached from the resin molding surface and the stamper surface configuration was correctly transferred to the resin molding surface. In close SEM observation of the stamper after 100 times of repetition of the nanoimprinting operation, there was admitted no damage to the fine structure, which confirmed that the fine metal structure made according to the present invention has sufficient resin releasability and strength.

EXAMPLE 9

DNA-Fixed Ni Nanopillars

Illustrated in this example is application of the fine metal structure as a high-sensitivity DNA chip by fixing DNA probes to the gold-plated surface of the metal structure.

The principle of DNA chip is as follows. First, the DNA target for analysis is labeled, and this labeled DNA target is hybridized with a DNA probe fixed on the substrate. The DNA target is specifically hybridized with a DNA probe having a base sequence complementary to the particular DNA target among a plurality of fixed DNA probes. Then the signal issued from the DNA target hybridized with the DNA probe is determined. By determining this signal, it is possible to identify the DNA probe with which the DNA target is hybridized and to determine the amount of the hybridized DNA target. For example, in case a fluorescein-labeled DNA target is used, the value given by deducting the background from the fluorescent signal value in the hybridized region is the amount of detection, so that it is possible to elevate the detection sensitivity by increasing the fluorescent signal value in the hybridized region while reducing the background. For enhancing the fluorescent signal value against the background, it is effective to increase the surface area of the substrate where the DNA probes are fixed. In this example, therefore, there is shown application of a fine nickel-boron alloy structure having its surface plated with gold as a substrate drastically increased in surface area in comparison with a flat plate.

A DNA-fixed substrate produced by way of trial in this example is schematically shown in FIG. 10. First, a nickel-phosphorus alloy film 1002 (20 mm×40 mm) having the cylindrical microprojections on the surface and coated with a gold layer 1001 supported by a polystyrene support film 1003 was obtained (FIG. 10(a)) according to the method of Example 5. The cylindrical microprojections formed on the alloy film 1002 measured 180 nanometers in diameter of the bottom portion, 160 nanometers in diameter of the of the top end and 1.5 micrometers in height, and the pitch between the centers of the adjoining microprojections was 300 nanometers. Then the polystyrene support film 1003 was attached to a slide glass substrate 1004 to provide a DNA fixation substrate furnished with the cylindrical microprojections on the surface.

Then, a thiol group-introduced DNA probe 1005, represented by the following Sequence No. 1, was synthesized by an automatic DNA synthesizer (Model 394 mfd. by Applied Biosystem Inc.).

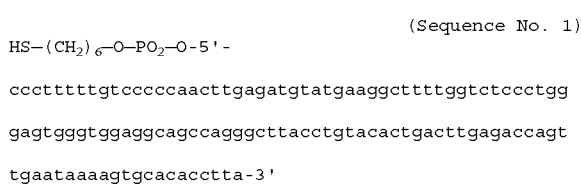

The obtained DNA probes 1005 were refined by high speed liquid chromatography. Then, 1 µl of 2 µM DNA probe, 4 µl of HEPES buffer solution (N-2-hydroxyethylpiperazine-N-2-ethanesulfonic acid; 10 mM, pH 6.5) and 5 µl of an additive (ethylene glycol) were mixed to prepare a spotting solution. This spotting solution was spotted on an arbitrarily selected point of the gold layer 1001 on the DNA fixing substrate surface by a spotter (SPBIO 2000 mfd. by Hitachi Soft Co., Ltd.) and allowed to stand at room temperature for 2 hours to cause bonding of the gold layer 1001 with thiol groups of the DNA probe 1005 to fix the DNA probe 1005 on the DNA fixing substrate having cylindrical microprojections on the surface (FIG. 10(b)). DNA spotting was conducted by pressing a metallic needle carrying the spotting solution at its end against the substrate surface. Generally, in case a substrate having micro-cylinders of high aspect ratio on the surface is used as the DNA fixing substrate, there is a possibility of causing damage to the micro-cylinders during the spotting operation. However, in case of using a substrate having micro-cylinders on the surface produced by applying the present invention, there can be obtained the cylindrical microprojections with satisfactorily high strength, and indeed there was noted no damage to the micro-cylinders after spotting in the above operation.

A DNA target having a base sequence complementary to the DNA probe 1005 and fluorescence labeled with Texas red at the 5' terminal was synthesized by an automatic DNA synthesizer. Then 8 μl of 0.1 μM DNA target, 1.7 μl of 20×SSC (produced by Wako Pure Chemicals Co., Ltd.) and 0.3 μl of a 10% sodium dodecylsulfate solution (produced by Lifetec Oriental Co., Ltd.) were mixed to prepare a hybridization solution. This hybridization solution was dropped onto a DNA fixing substrate having the DNA probe-fixed cylindrical microprojections on the surface and, with a cover glass placed thereon, the substrate was left in a 40° C. thermostat for 12 hours to carry out a hybridization reaction. After the hybridization reaction, the slide glass was dipped in a mixture of a 10-fold diluted solution of 20×SSC and a 300-fold diluted 10% sodium dodecylsulfate solution to remove cover glass, and then the slide glass was washed with a 100-fold diluted 2.0×SSC solution. Lastly, after removing water on the substrate by a microtiter plate centrifuge, fluorescence intensity in the region where the DNA probe 1005 was fixed (hybridization signal) and fluorescence intensity in the region where the DNA probe 1005 was not fixed (background signal) were determined by a microarray scanner (Scan Array 5000 mfd. by GSI Lumonics Ltd.).

Then a similar experiment was carried out except that a slide glass substrate having a flat gold film on the surface was used in place of the DNA fixing substrate having cylindrical microprojections on the surface, and fluorescence intensity in the region where the DNA probe was fixed (hybridization signal) and fluorescence intensity in the region where the DNA probe was not fixed (background signal) were determined. The said slide glass substrate having a flat gold film on the surface was made by depositing gold on a slide glass to a buildup of 100 nanometers.

Hybridization was carried out using the DNA fixing substrate having cylindrical microprojections on the surface and the slide glass substrate having a flat gold-plated surface, and the ratio of fluorescence intensity in the region where the DNA probe 1005 was fixed to that in the region where the DNA probe 1005 was not fixed was determined, the results being shown in Table 6.

TABLE 6

Ratio of fluorescence intensity in the region where the DNA probe was fixed to that in the region where the DNA probe was not fixed

| Substrate | Fluorescence intensity ratio |
|---|---|
| Slide glass substrate having a flat gold surface | 80 |
| DNA fixing substrate having cylindrical microprojections on the surface | 780 |

From the results of Table 6, it was found that high-sensitivity detection of DNA is made possible by applying the fine metal structure obtained according to the present invention as a DNA fixing substrate.

EXAMPLE 10

DNA Chip

Using the method of Example 9, there was produced a DNA chip in which 200 types of single-stranded DNA probes per sheet of slide glass were fixed in a regular array. Used as DNA probes were single-stranded DNA probes of 25 base sequences having their terminals modified by a thiol group, which were synthesized according to the method of Example 9. As the base sequences possessed respectively by the 200 types of DNA probes, there were used the continuous 25 base sequences peculiar to the respective 200 types of gene fragments shown in Tables 7 to 14.

A hybridization solution was prepared by the following method. Approximately $2 \times 10^6$ pancreatic cancer cells (CF-PAC1 produced by American Type Culture Collection Inc.) and 10 ml of a medium were supplied to a dish, and the cells were cultured at 37° C. for one week, changing the medium once every two days. A 9:1 mixed solution of D-MEM (produced by Lifetec Oriental Co., Ltd.) and Fetal Bovine Serum Qualified (produced by Lifetec Oriental Co., Ltd.) was used as the medium. After cultivation, the medium was removed from the dish and a GTC solution (comprising 4M guanidine thiocyanate, 0.1M tris(hydroxymethyl)aminomethane and 1% 2-mercaptoethanol; pH 7.5) was added, dissolving the cultured cells therein. Then, after adding sodium N-lauroyl-sarcosinate so that the final concentration of the solution would become 0.5%, the solution was centrifuged at 5,000 rpm for 10 minutes and the supernatant liquid was taken out. A 5.7M cesium chloride solution was added to the supernatant liquid so that the supernatant/cesium chloride solution ratio would become 7/3, to which a proper quantity of light liquid paraffin was added, and the solution was centrifuged at 35,000 rpm for 12 hours. After centrifuging, the RNA pellets deposited in the lower layer were taken out. The thus obtained RNA pellets were dissolved in a proper quantity of TES solution (comprising 10 mM tris(hydroxymethyl)aminomethane, 5 mM ethylenediamine tetracetate and 1% sodium dodecylsulfate, pH 7.4) and concentrated and purified by ethanol precipitation. The purified RNA pellets were dissolved in a DEPC solution (0.1% diethyl dioxide) and then mRNA was separated from the RNA pellets by using an m-RNA purification kit (Micro-Fast Track 2.0 Kit mfd. by Invitrogen Co., Ltd.). The thus obtained mRNA was diluted to 1 μg/μl, then 1 μl of a 0.5 μg/μ Oligo dT Primer (produced by Lifetec Oriental Co., Ltd.) and 5 μl of DEPC solution were added to 1 μl of the dilute solution, and the mixed solution was kept at 70° C. for 5 minutes. To 5 μl of the thus prepared solution were added 5 μl of Super Script II buffer (Super Script II Reverse Transcriptase produced by Lifetec Oriental Co., Ltd.), 2 μl of dNTP mixture (comprising 2 mM dUTP, 5 mM dATP, 5 mM dGTP and 5 mM dCTP), 2 μl of 100 mM DTT (dithiothreitol), 2.5 μl of 40 U resin (Rnase Inhibitor produced by Toyobo Co., Ltd.), 2 μl of 1 mM FluoriLink dUTP (Fluoro Link Cy5-dUTP produced by Amacham Farmacia Co., Ltd.) and 1 μl of SSII (Super Script II Reverse Transscriptase produced by Lifetec Oriental Co., Ltd.), and the mixed solution was kept 42° C. for 30 minutes. Then 1 μl of SSII (Super Script II Reverse Transcriptase produced by Lifetec Oriental Co., Ltd.) was further added, and the solution was again kept at 42° C. for 30 minutes. Thereafter, 20 μl of DEPC solution, 5 μl of 0.5M ethylenediamine tetracetate and 10 μl of a 1N sodium hydroxide solution were added, the mixed solution was kept at 65° C. for 60 minutes, and then 25 μl of a 1M tris(hydroxymethyl)aminomethane buffer solution (pH 7.5) was added to neutralized the solution. The neutralized sample solution was put into Microcon-30 (produced by Amicon Co., Ltd.), centrifuged at 8,000 rpm for 4 minutes and concentrated to 10 to 20 μl, and the unreacted dNTP was removed. The obtained solution was mixed with proper quantities of 20×Denhardt's solution (produced by Sigma Co., Ltd.), 20×SSC and sodium dodecylsulfate to thereby prepare 24.5 μl of a hybridization solution with final concentrations of 100 pg/μl DNA target, 2×Denhardt's solution, 4×SSC and 0.2% sodium dodecylsulfate.

The following hybridization reaction was carried out using the thus obtained DNA chips and hybridization solution.

The hybridization solution, after one-minute thermal denaturation at 95° C., was dropped onto a slide glass and a cover glass was placed thereon. Then the slide glass was left in a 40° C. thermostat for 12 hours to conduct a hybridization reaction. After the hybridization reaction, the slide glass was dipped in a mixture of a 10-fold diluted solution of 20×SSC and a 300-fold diluted version of a 10% sodium dodecylsulfate solution, and after removing the cover glass, the slide glass was washed with a 100-fold diluted solution of 20×SSC. Then, after removing water on the slide glass by a microtiter plate centrifuge, the fluorescence intensity at 200 spots (hybridization signal) and the fluorescence intensity in the region where the DNA probes were not fixed (background signal) were measured by using a microarray scanner (Scan Array 5000 mfd. by GSI Lumonics Co., Ltd.). The fluorescent yield at each of the 200 spots was determined by deducting the background signal from the hybridization signal measured as described above. The above hybridization reaction was carried out twice, and by plotting the fluorescent yield in the initial hybridization at each point as abscissa and the fluorescent yield in the second hybridization as ordinate, there were obtained the scattered plots such as shown in FIG. 11.

Then the DNA chips were made in the same way as described above except for use of a slide glass substrate having a flat gold film on the surface in place of the DNA fixing substrate having cylindrical microprojections on the surface, and the above hybridization was carried out, obtaining the scattered plots shown in FIG. 12.

The DNA chip using a DNA fixing substrate having cylindrical microprojections on the surface is enlarged in surface area and improved in DNA target detection sensitivity, and as apparent from the comparison of FIG. 11 and FIG. 12, when using the DNA fixing substrate having cylindrical microprojections on the surface, the dynamic range of fluorescence intensity is widened and the scatter of reproducibility of measurement is lessened in comparison with when using a substrate having a flat surface.

TABLE 7

Gene used for nucleic acid probes (1)

| GenBank | GENE NAME |
|---|---|
| A03911 | *H. sapiens* mRNA for glia-derived neurite-promoting factor (GdNPF) |
| A26792 | *H. sapiens* CNTF coding sequece (form b + c)(comp.) |
| AB003791 | *Homo sapiens* mRNA for keratan sulfate Gal-6-sulfotransferase |
| AB012192 | *Homo sapiens* mRNA for chondroitin 6-sulfotransferase |
| AF000546 | *Homo sapiens* purinergic receptor P2Y5 mRNA |
| AF000974 | Human zyxin related protein ZRP-1 mRNA |
| AF001954 | *Homo sapiens* growth inhibitor p33ING1 (ING1) mRNA |
| AF004430 | *Homo sapiens* hD54 + ins2 isoform (hD54) mRNA |
| AF007111 | *Homo sapiens* MDM2-like p53-binding protein (MDMX) mRNA |
| AF009674 | *Homo sapiens* axin (AXIN) mRNA |
| AF010127 | *Homo sapiens* Casper mRNA |
| AF010310 | *Homo sapiens* p53 induced protein mRNA partial cds |
| AF013168 | *Homo sapiens* hamartin (TSC1) mRNA |
| AF015950 | *Homo sapiens* telomerase reverse transcriptase (hTRT) mRNA |
| AF016267 | *Homo sapiens* TRAIL receptor 3 mRNA |
| AF016268 | *Homo sapiens* death receptor 5 (DR5) mRNA |
| AF016582 | *Homo sapiens* checkpoint kinase Chk1 (CHK1) mRNA |
| AF018253 | *Homo sapiens* receptor activator of nuclear factor-kappa B (RANK) mRNA |
| AF019770 | *Homo sapiens* macrophage inhibitory cytokine-1 (MIC-1) mRNA |
| AF019952 | *Homo sapiens* tumor suppressing STF cDNA 1 (TSSC1) mRNA |
| AF022109 | *Homo sapiens* HsCdc18p (HsCdc18) mRNA |
| AF022224 | *Homo sapiens* Bcl-2-binding protein (BAG-1) mRNA |
| AF026816 | *Homo sapiens* putative oncogene protein mRNA partial cds |
| AF029403 | *Homo sapiens* oxysterol 7alpha-hydroxylase (CYP7b1) mRNA |
| AF037195 | *Homo sapiens* regulator of G protein signaling RGS14 mRNA |
| AF038009 | *Homo sapiens* tyrosylprotein sulfotransferase-1 mRNA |
| AF040705 | *Homo sapiens* putative tumor suppressor protein unspliced form (Fus-2) mRNA |
| AF040707 | *Homo sapiens* candidate tumor suppressor gene 21 protein isoform I mRNA |

TABLE 8

Gene used for nucleic acid probes (2)

| GenBank | GENE NAME |
|---|---|
| AF043254 | *Homo sapiens* heat shock protein 75 (hsp75) mRNA |
| AF049891 | *Homo sapiens* tyrosylprotein sulfotransferase-2 mRNA |
| AF053712 | *Homo sapiens* osteoprotegerin ligand mRNA |
| AF055584 | *Homo sapiens* SULT1C sulfotransferase (SULT1C) mRNA |
| AF059195 | *Homo sapiens* basic-leucine zipper transcription factor MafG (MAFG) mRNA |
| AF061836 | *Homo sapiens* putative tumor suppressor protein (RDA32) mRNA |
| AF067512 | *Homo sapiens* PITSLRE protein kinase alpha SV1 isoform (CDC2L1) mRNA |
| AF067519 | *Homo sapiens* PITSLRE protein kinase beta SV1 isoform (CDC2L2) mRNA |
| AF070594 | *Homo sapiens* clone 24570 HNK-1 sulfotransferase mRNA |
| AF087017 | *Homo sapiens* H19 gene complete sequence |
| AF090318 | *Homo sapiens* sterol 12-alpha hydroxylase CYP8B1 (Cyp8b1) mRNA |
| AF112219 | *Homo sapiens* esterase D mRNA |
| AF188698 | *Homo sapiens* sulfotransferase-like protein mRNA |
| AF237982 | *Homo sapiens* oxysterol 7alpha-hydroxylase (CYP39A1) mRNA |
| AI445492 | NCI_CGAP_Gas4 *Homo sapiens* cDNA clone IMAGE: 2142448 3' mRNA sequence |
| AJ004832 | *Homo sapiens* mRNA for neuropathy target esterase |
| AL021878 | Human CYP2D7AP |
| AL021878 | Human CYP2D8P |
| D14012 | Human mRNA for hepatocyte growth factor (HGF) activator precursor |
| D14497 | Human mRNA for proto-oncogene protein |
| D14838 | Human mRNA for FGF-9 |
| D14889 | Human mRNA for small GTP-binding protein S10 |
| D16234 | Human mRNA for phospholipase C-alpha |

TABLE 8-continued

Gene used for nucleic acid probes (2)

| GenBank | GENE NAME |
| --- | --- |
| D26512 | Human mRNA for membrane type matrix metalloproteinase |
| D37965 | Human mRNA for PDGF receptor beta-like tumor suppressor (PRLTS) |

TABLE 9

Gene used for nucleic acid probes (3)

| GenBank | GENE NAME |
| --- | --- |
| D38122 | Human mRNA for Fas ligand |
| D38305 | Human mRNA for Tob |
| D43968 | Human AML1 mRNA for AML1b protein (alternatively spliced product) |
| D49742 | Human mRNA for HGF activator like protein |
| D50310 | Human mRNA for cyclin I |
| D86640 | *Homo sapiens* mRNA for stac, complete cds |
| D88667 | *Homo sapiens* mRNA for cerebroside sulfotransferase |
| D89479 | *Homo sapiens* mRNA for ST1B2 |
| D89667 | *Homo sapiens* mRNA for c-myc binding protein |
| D90224 | Human mRNA for glycoprotein 34 (gp34) |
| J02625 | Human cytochrome P-450j mRNA |
| J02871 | Human lung cytochrome P450 (IV subfamily) BI protein |
| J02906 | Human cytochrome P450IIF1 protein (CYP2F) mRNA |
| J02958 | Human MET proto-oncogene mRNA |
| J03210 | Human collagenase type IV mRNA 3' end |
| J03241 | Human transforming growth factor-beta 3 (TGF-beta3) mRNA |
| J03518 | Human epoxide hydrolase microsomal (xenobiotic) (EPHX1) mRNA |
| J03528 | Human cation-independent mannose 6-phosphate receptor mRNA |
| J03817 | Human glutathione transferase M1B (GST1) mRNA |
| J03934 | Human, NAD(P)H: menadione oxidoreductase mRNA |
| J04093 | *Homo sapiens* phenol UDP-glucuronosyltransferase (UDPGT) mRNA |
| J04127 | Human aromatase system cytochrome P-450 (P450XIX) mRNA |
| J05070 | Human type IV collagenase mRNA |
| J05459 | Human glutathione transferase M3 (GSTM3) mRNA |
| K01171 | Human HLA-DR alpha-chain mRNA |
| K02276 | Human (Daudi) translocated t(8; 14) c-myc oncogene mRNA |
| K03191 | Human cytochrome P-1-450 (TCDD-inducible) mRNA |
| K03222 | Human (cell line 1027 F57) transforming growth factor-alpha mRNA |
| L03840 | Human fibroblast growth factor receptor 4 (FGFR4) mRNA |

TABLE 10

Gene used for nucleic acid probes (4)

| GenBank | GENE NAME |
| --- | --- |
| L04288 | *Homo sapiens* cyclophilin-related protein mRNA |
| L04751 | Human cytochrome p-450 4A (CYP4A) mRNA |
| L05779 | Human cytosolic epoxide hydrolase mRNA |
| L06895 | *Homo sapiens* antagonizer of myc transcriptional activity (Mad) mRNA |
| L07594 | Human transforming growth factor-beta type III receptor (TGF-beta) mRNA |
| L07765 | Human carboxylesterase mRNA |
| L07868 | *Homo sapiens* receptor tyrosine kinase (ERBB4) gene |
| L09753 | *Homo sapiens* CD30 ligand mRNA |
| L11353 | Human moesin-ezrin-radixin-like protein mRNA |
| L12260 | Human recombinant glial growth factor 2 mRNA and flanking regions |
| L12964 | Human activation dependent T cell mRNA |
| L13286 | Human mitochondrial 125-dihydroxyvitamin D3 24-hydroxylase mRNA |
| L13972 | *Homo sapiens* beta-galactoside alpha-23-sialyltransferase (SIAT4A) mRNA |
| L15409 | *Homo sapiens* von Hippel-Lindau disease tumor suppressor mRNA sequence |

TABLE 10-continued

Gene used for nucleic acid probes (4)

| GenBank | GENE NAME |
| --- | --- |
| L17075 | Human TGF-b superfamily receptor type I mRNA |
| L19063 | Human glial-derived neurotrophic factor gene |
| L19067 | Human NF-kappa-B transcription factor p65 subunit mRNA |
| L20320 | Human protein serine/threonine kinase stk1 mRNA |
| L22005 | Human ubiquitin conjugating enzyme mRNA |
| L22474 | Human Bax beta mRNA |
| L25610 | *Homo sapiens* cyclin-dependent kinase inhibitor mRNA |
| L25676 | *Homo sapiens* CDC2-related kinase (PITALRE) mRNA |
| L25851 | *Homo sapiens* integrin alpha E precursor mRNA |
| L27211 | Human CDK4-inhibitor (p16-INK4) mRNA |
| L29216 | *Homo sapiens* clk2 mRNA |

TABLE 11

Gene used for nucleic acid probes (5)

| GenBank | GENE NAME |
| --- | --- |
| L29220 | *Homo sapiens* clk3 mRNA |
| L29222 | *Homo sapiens* clk1 mRNA |
| L29277 | *Homo sapiens* DNA-binding protein (APRF) mRNA |
| L32179 | Human arylacetamide deacetylase mRNA |
| L33264 | *Homo sapiens* CDC2-related protein kinase (PISSLRE) mRNA |
| L35253 | Human p38 mitogen activated protein (MAP) kinase mRNA |
| L40027 | *Homo sapiens* glycogen synthase kinase 3 mRNA |
| L78440 | *Homo sapiens* STAT4 mRNA |
| M10988 | Human tumor necrosis factor (TNF) mRNA |
| M11730 | Human tyrosine kinase-type receptor (HER2) mRNA |
| M12272 | *Homo sapiens* alcohol dehydrogenase class I gamma subunit (ADH3) mRNA |
| M12783 | Human c-sis/platelet-derived growth factor 2 (SIS/PDGF2) mRNA |
| M12963 | Human class I alcohol dehydrogenase (ADH1) alpha subunit mRNA |
| M13194 | Human excision repair protein (ERCC1) mRNA clone pcDE |
| M13228 | Human N-myc oncogene protein mRNA |
| M13755 | Human interferon-induced 17-kDa/15-kDa protein mRNA |
| M14505 | Human (clone PSK-J3) cyclin-dependent protein kinase mRNA. |
| M14564 | Human cytochrome P450c17 (steroid 17-alpha-hydroxylase/1720 lyase) mRNA |
| M14695 | Human p53 cellular tumor antigen mRNA |
| M14745 | Human bcl-2 mRNA |
| M14764 | Human nerve growth factor receptor mRNA |
| M15024 | Human c-myb mRNA |
| M15400 | Human retinoblastoma susceptibility mRNA |
| M16038 | Human lyn mRNA encoding a tyrosine kinase |
| M17016 | Human serine protease-like protein mRNA |
| M17252 | Human cytochrome P450c21 mRNA 3' end |
| M18112 | Human poly(ADP-ribose) polymerase mRNA |

TABLE 12

Gene used for nucleic acid probes (6)

| GenBank | GENE NAME |
| --- | --- |
| M18737 | Human Hanukah factor serine protease (HuHF) mRNA (cytotoxic T-lymphocyte-associated serine esterase 3) |
| M19154 | Human transforming growth factor-beta-2 mRNA |
| M19720 | Human L-myc protein gene |
| M19722 | Human fgr proto-oncogene encoded p55-c-fgr protein |
| M20403 | Human cytochrome P450 db1 mRNA |
| M21574 | Human platelet-derived growth factor receptor alpha (PDGFRA) mRNA |
| M21616 | Human platelet-derived growth factor (PDGF) receptor mRNA |
| M21758 | Human glutathione S-transferase A2 (GSTA2) mRNA |
| M22995 | Human ras-related protein (Krev-1) mRNA |
| M23619 | Human HMG-I protein isoform mRNA (HMGI gene) clone 6A |
| M24898 | Human triiodothyronine recptor (THRA1 ear1) mRNA |
| M25753 | Human cyclin B mRNA 3' end |
| M26880 | Human ubiquitin mRNA |

TABLE 12-continued

Gene used for nucleic acid probes (6)

| GenBank | GENE NAME |
|---|---|
| M27968 | Human basic fibroblast growth factor (FGF) mRNA |
| M28209 | Homo sapiens GTP-binding protein (RAB1) mRNA |
| M28211 | Homo sapiens GTP-binding protein (RAB4) mRNA |
| M28215 | Homo sapiens GTP-binding protein (RAB5) mRNA |
| M29366 | Human epidermal growth factor receptor (ERBB3) mRNA |
| M29870 | Human ras-related C3 botulinum, toxin substrate (rac) mRNA variant 1 |
| M30496 | Human ubiquitin carboxyl-terminal hydrolase (PGP 9.5, UCH-L3) isozyme L3 mRNA |
| M30817 | Human interferon-induced cellular resistance mediator protein (MxA)mRNA |
| M30818 | Human interferon-induced cellular resistance mediator protein (MxB) mRNA |
| M31165 | Human tumor necrosis factor-inducible (TSG-6) mRNA fragment adhesion receptor CD44 putative CDS |
| M31899 | Human DNA repair helicase (ERCC3) mRNA |

TABLE 13

Gene used for nucleic acid probes (7)

| GenBank | GENE NAME |
|---|---|
| M32977 | Human heparin-binding vascular endothelial growth factor (VEGF) mRNA |
| M33318 | Human cytochrome P450IIA3 (CYP2A3) mRNA |
| M34065 | Human cdc25Hs mRNA |
| M34309 | Human epidermal growth factor receptor (HER3) mRNA |
| M34641 | Human fibroblast growth factor (FGF) receptor-1 mRNA |
| M35296 | Human tyrosine kinase arg gene mRNA |
| M35410 | Human insulin-like growth factor binding protein 2 (IGFBP2) mRNA |
| M35416 | Human GTP-binding protein (RALB) mRNA |
| M35543 | Human GTP-binding protein (G25K) mRNA |
| M36542 | Human lymphoid-specific transcription factor mRNA |
| M36981 | Human putative NDP kinase (nm23-H2S) mRNA |
| M37825 | Human fibroblast growth factor-5 (FGF-5) mRNA |
| M54915 | Human h-pim-1 protein (h-pim-1) mRNA |
| M54968 | Human K-ras oncogene protein mRNA |
| M55618 | Homo sapiens hexabrachion (HXB) mRNA |
| M57230 | Human membrane glycoprotein gp130 mRNA |
| M57732 | Human hepatic nuclear factor 1 (TCF1) mRNA |
| M58051 | Human fibroblast growth factor receptor (FGFR3) mRNA |
| M58525 | Homo sapiens catechol-O-methyltransferase (COMT) mRNA |
| M59040 | Human cell adhesion molecule (CD44) mRNA |
| M59465 | Human tumor necrosis factor alpha inducible protein A20 mRNA |
| M59964 | Human stem cell factor mRNA |
| M60278 | Human heparin-binding EGF-like growth factor mRNA |
| M60614 | Human Wilms' tumor (WIT-1) associated protein mRNA |
| M60618 | Human nuclear autoantigen (SP-100) mRNA |
| M60718 | Human hepatocyte growth factor mRNA |
| M60828 | Human keratinocyte growth factor mRNA |
| M60854 | Human ribosomal protein S16 mRNA |
| M60915 | Human neurofibromatosis protein type I (NF1) mRNA |

TABLE 14

Gene used for nucleic acid probes (8)

| GenBank | GENE NAME |
|---|---|
| M60974 | Human growth arrest and DNA-damage-inducible protein (gadd45) mRNA |
| M61176 | Homo sapiens brain-derived neurotrophic factor precursor (BDNF) mRNA |
| M61853 | Human cytochrome P4502C18 (CYP2C18) mRNA clone 6b |
| M61854 | Human cytochrome P4502C19 (CYP2C19) mRNA clone 11a |
| M61857 | Human cytochrome P4502C9 (CYP2C9) mRNA clone 65 |
| M62401 | Human sterol 27-hydroxylase (CYP27) mRNA |
| M62829 | Human transcription factor ETR103 mRNA |
| M63167 | Human rac protein kinase alpha mRNA |
| M64240 | Human helix-loop-helix zipper protein (max) mRNA |
| M64349 | Human cyclin D (cyclin D1) mRNA |
| M68520 | Human cdc2-related protein kinase mRNA |
| M73791 | Human novel gene mRNA |
| M73812 | Human cyclin E mRNA sequence |

INDUSTRIAL APPLICABILITY

According to the present invention, it is possible to provide a fine metal structure having its surface furnished with microprojections of high strength, high precision and large aspect ratio, and a process for producing such a fine metal structure free of defects. It is also made possible to provide the high-precision and high-reliability apparatuses and devices using the said fine structure, particularly fine metal molds and nanoimprinters used for nanoimprinting in which resins or inorganic materials are pressure molded, and the electrodes and DNA chips for converting, producing or detecting the materials by an electrochemical reaction.

While the present invention has been described in conjunction with the embodiments thereof, it will be apparent to those skilled in the art that various changes and modifications can be made within the sprit and the scope defined by the appended claims of the present invention.

BRIEF DESCRIPTION OF THE DRAWINGS

FIG. 11 is scattered plots showing the result of a hybridization experiment using a DNA fixing substrate having microprojections on the surface.

FIG. 12 is scattered plots showing the result of a hybridization experiment using a DNA fixing substrate having a flat surface.

SEQUENCE LISTING

<160> NUMBER OF SEQ ID NOS: 1

Figure 1:
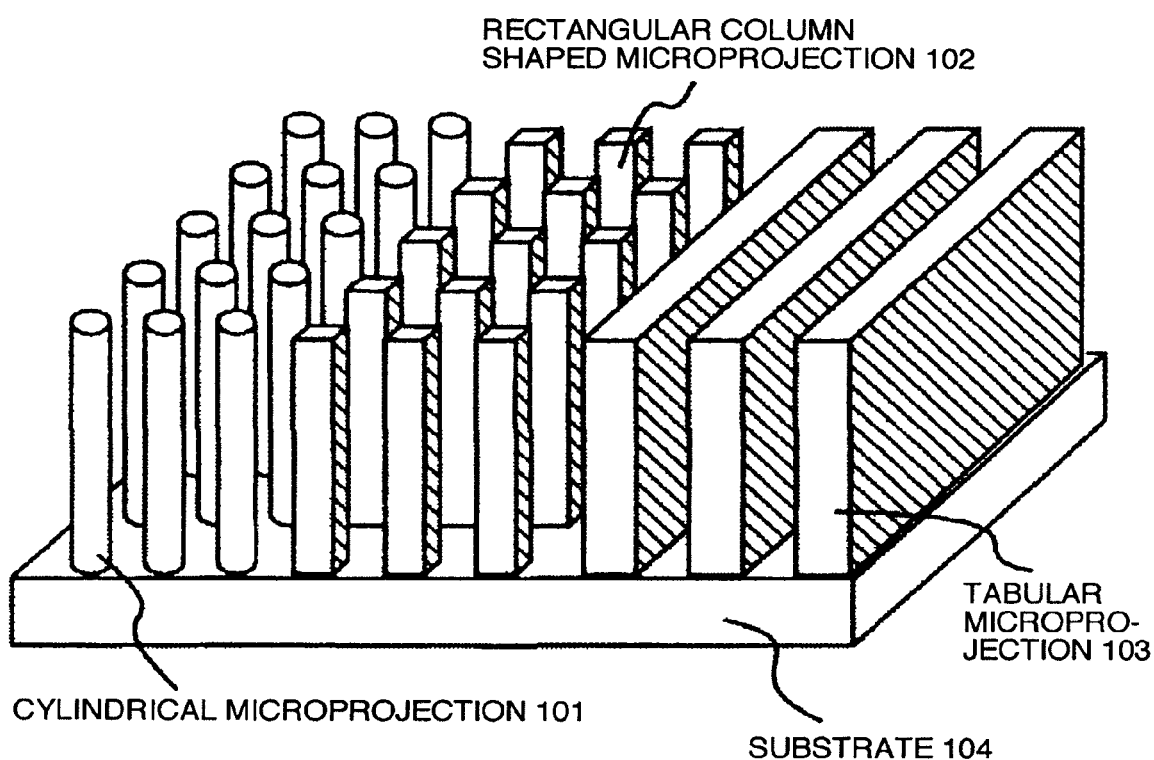
FIG. 1 is a schematic illustration of the makeup of a fine metal structure having microprojections on the surface.
Figure 2:
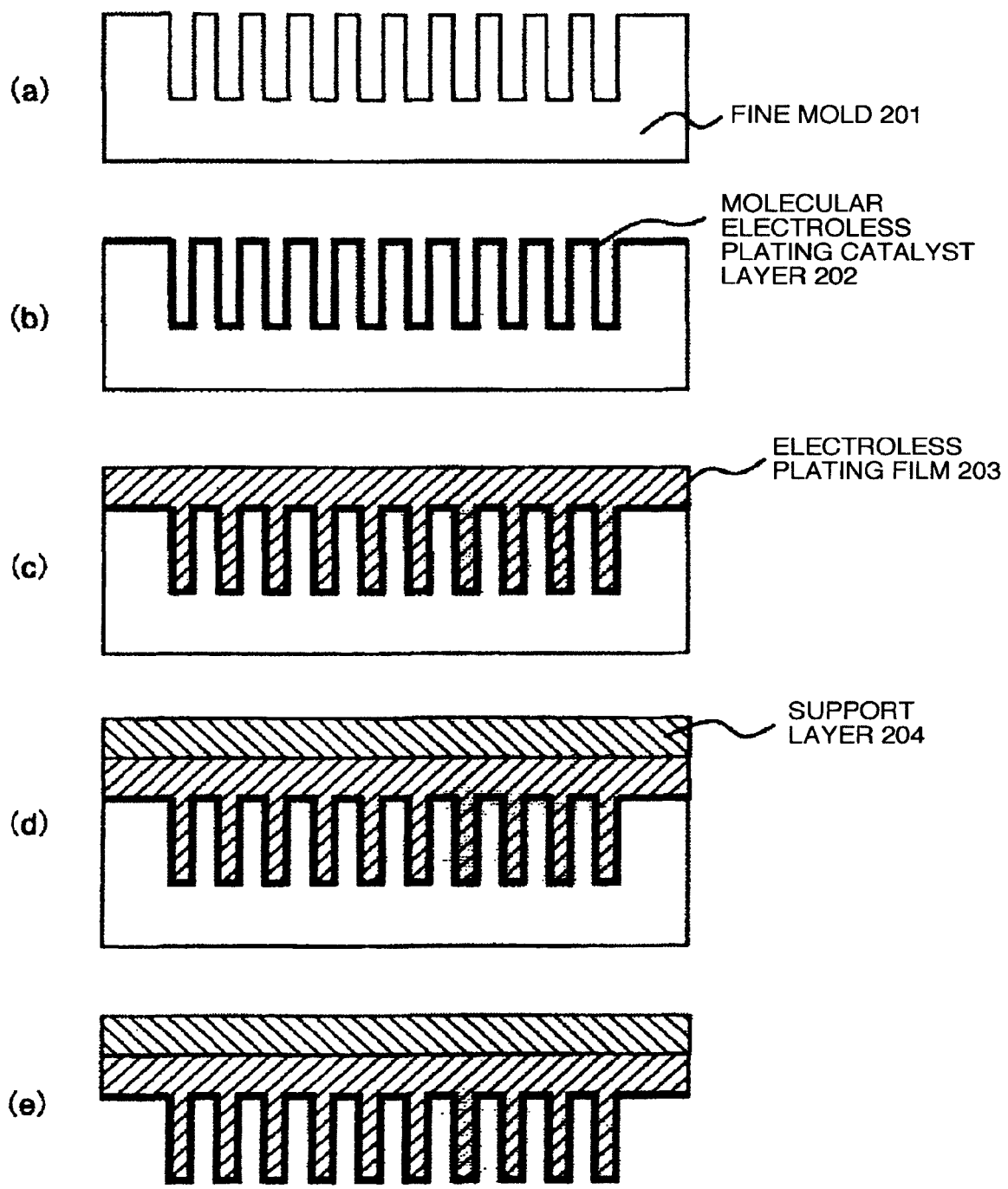
FIG. 2 is a flow sheet for producing a fine metal structure having microprojections on the surface.
Figure 3:
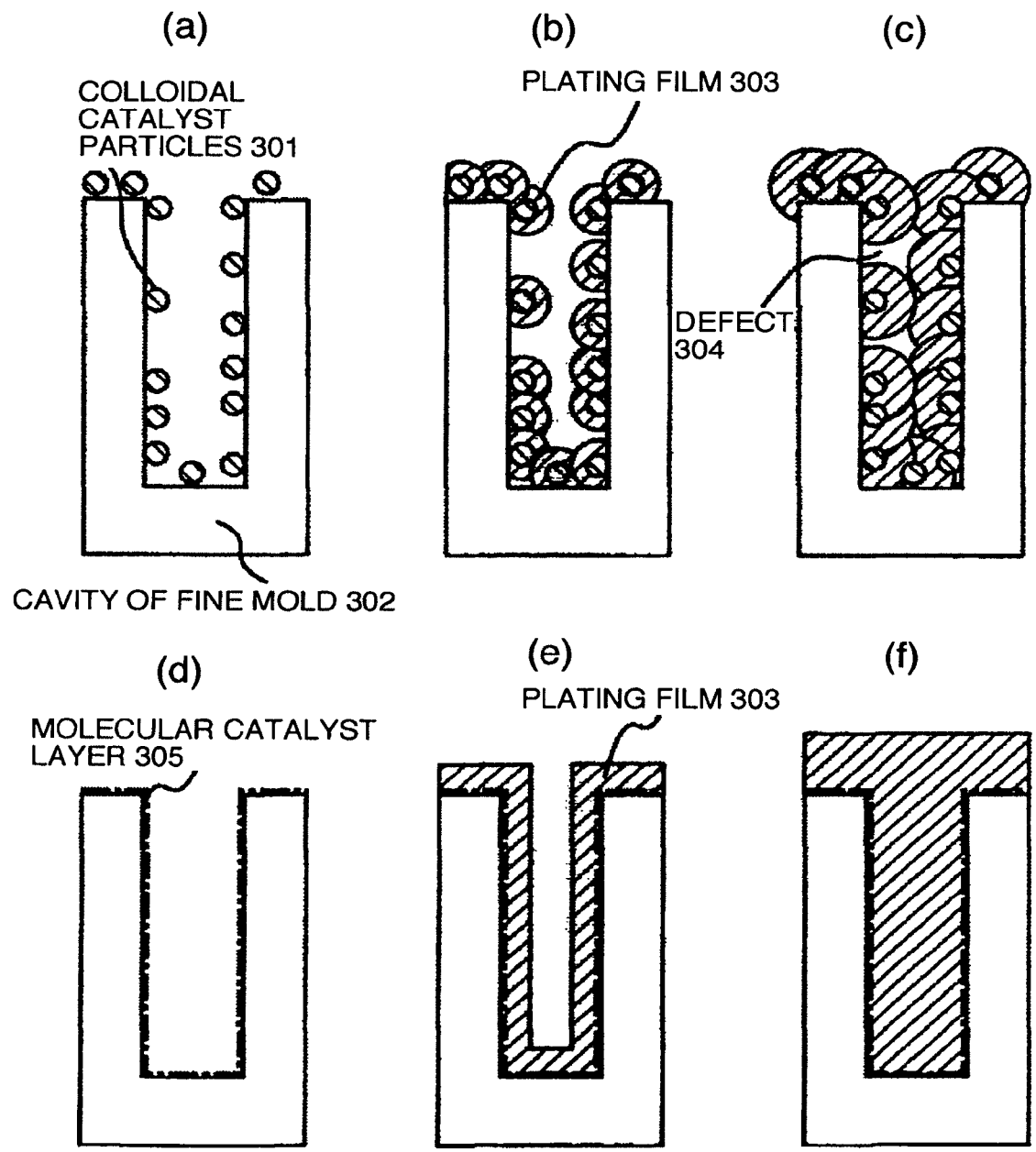
FIG. 3 schematically illustrates the process of growth of plating with a catalyst serving as a datum point.
Figure 4:
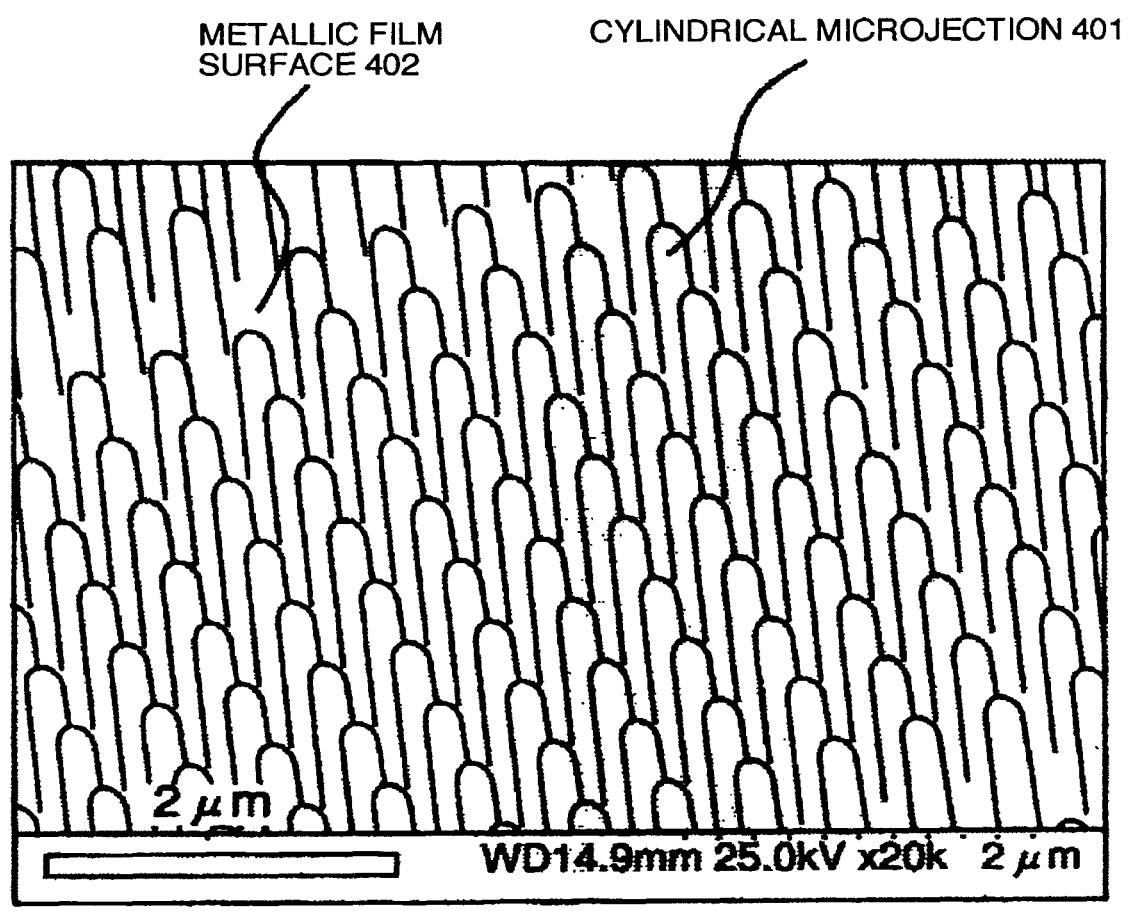
FIG. 4 is a schematic illustration based on a scanning electron microphotograph of the surface of a fine metal structure.
Figure 5:
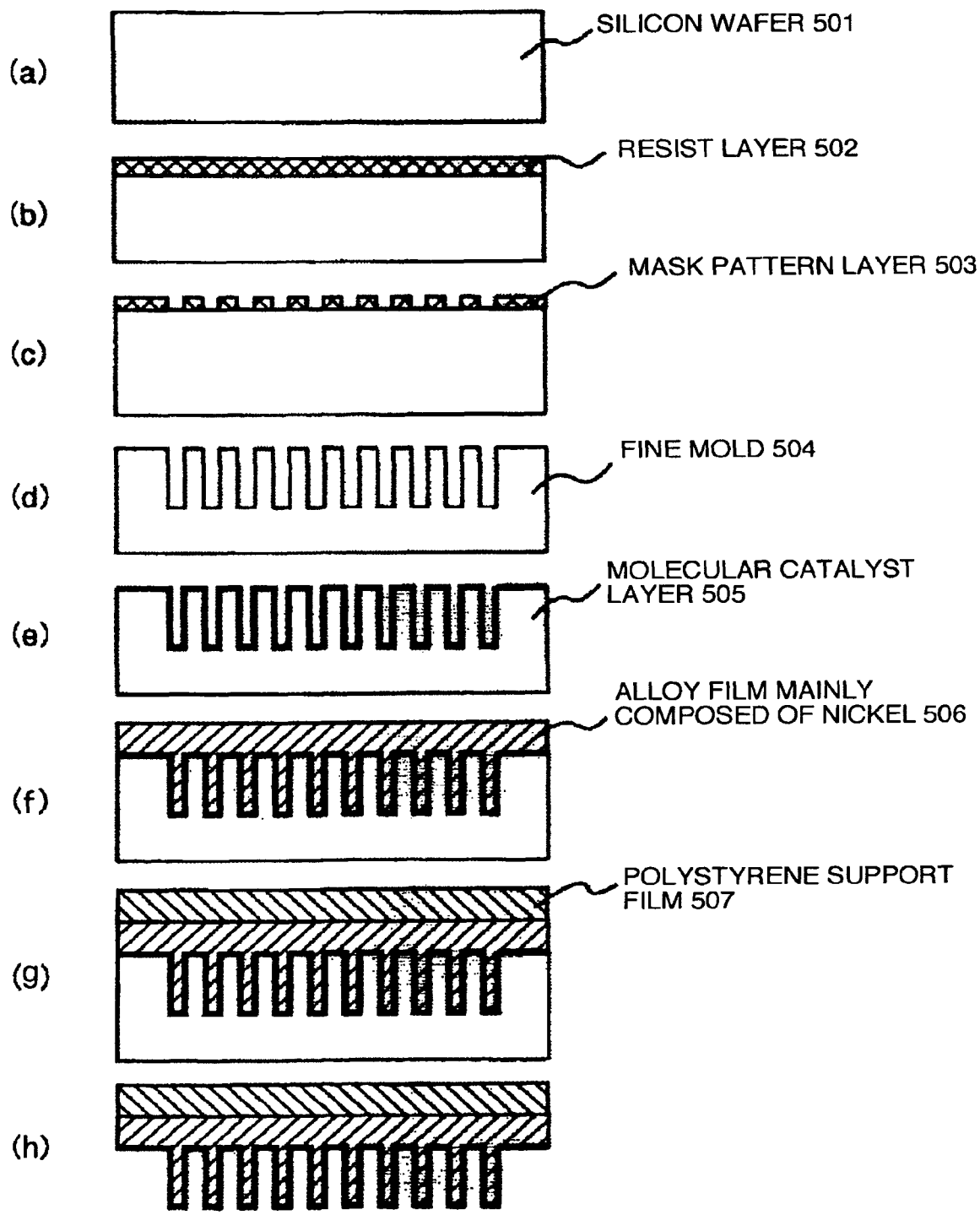
FIG. 5 is a flow sheet for producing a fine metal structure.
Figure 6:
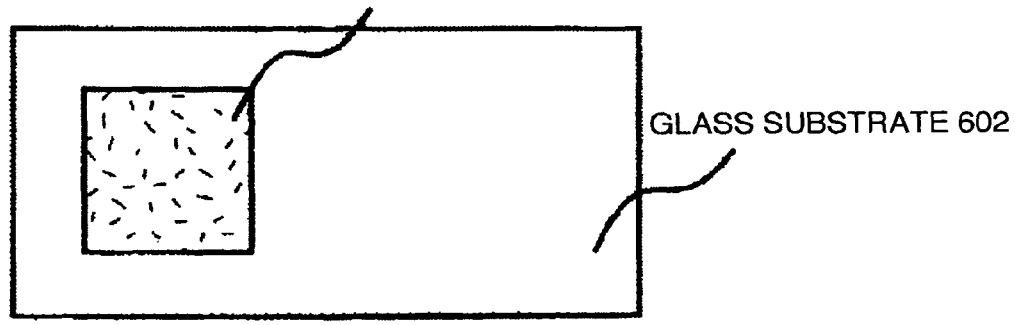
FIG. 6 is a flow sheet for producing a high-sensitivity gold electrode.
Figure 6:
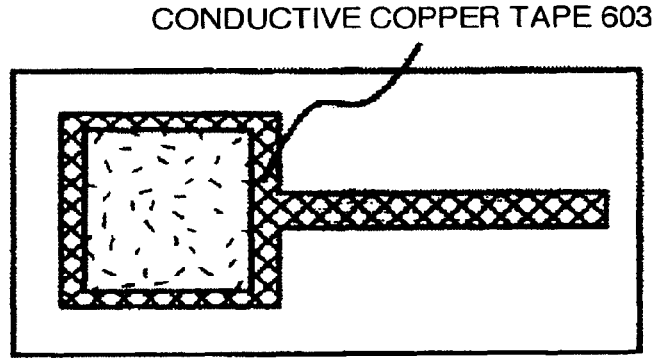
Figure 6:
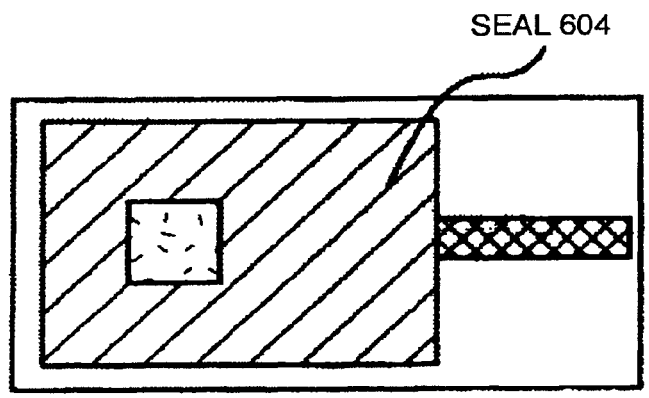
Figure 7:
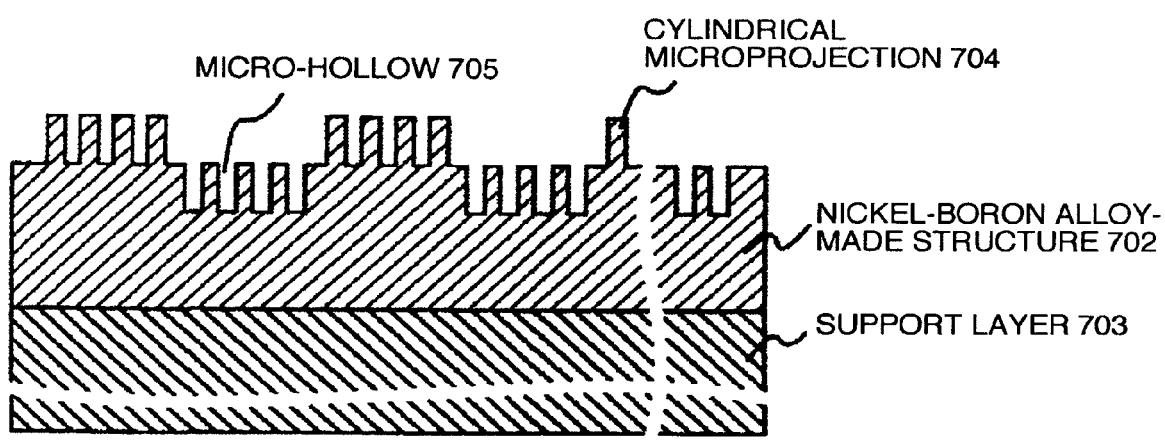
FIG. 7 is a schematic illustration of a stamper.
Figure 8:
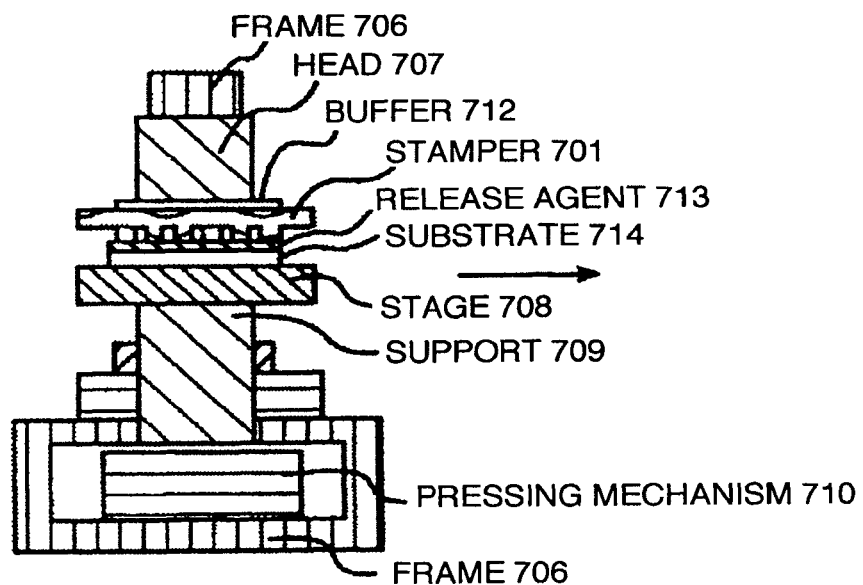
FIG. 8(a) is an apparatus for forming a peel ply on the convex surface of the stamper.
FIG. 8(b) is an apparatus for transferring fine ruggedness of the stamper to a substrate.
Figure 8:
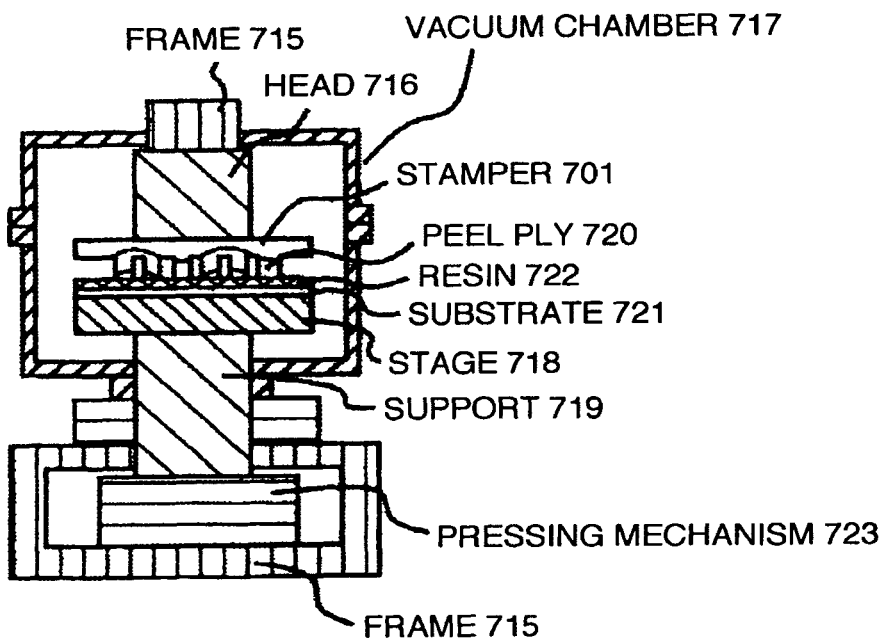
Figure 9:
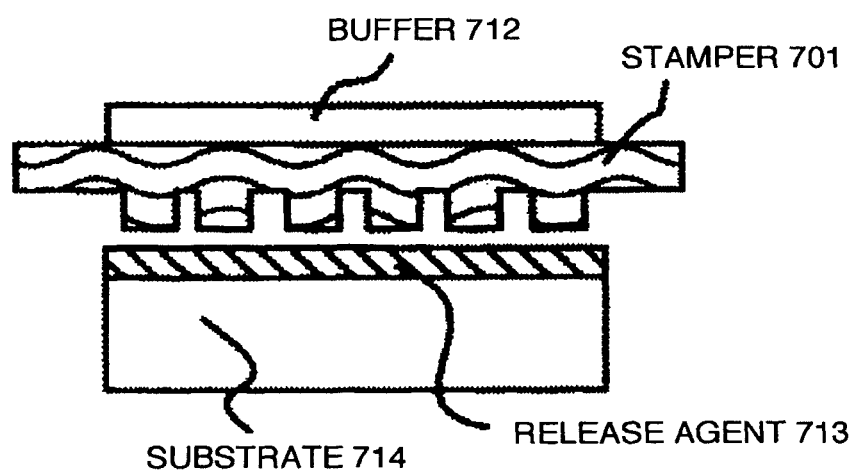
FIGS. 9(a) and 9(b) are the enlarged views of the portions near the stamper surface in the apparatuses of FIGS. 8(a) and 8(b), respectively.
Figure 9:
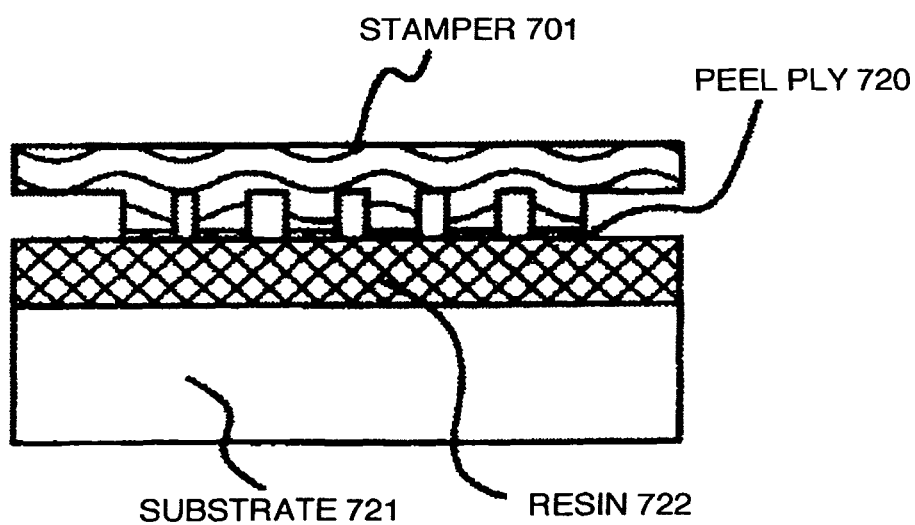
Figure 10:
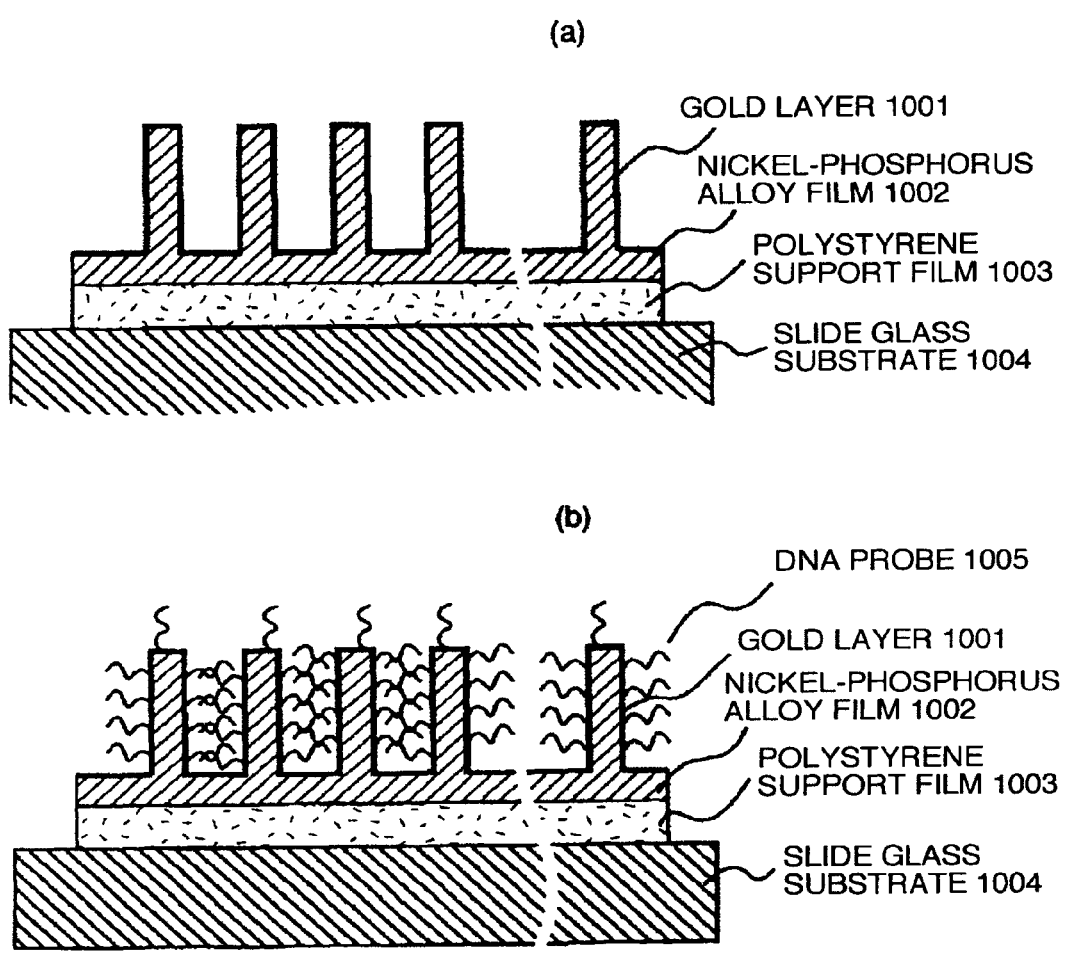
FIG. 10(a) is a schematic illustration of a DNA fixing substrate.
FIG. 10(b) is a schematic illustration showing the state of the DNA probes being fixed to the surface of a DNA fixing substrate.

<210> SEQ ID NO 1
<211> LENGTH: 121
<212> TYPE: DNA
<213> ORGANISM: Artificial Sequence
<220> FEATURE:
<223> OTHER INFORMATION: Description of Artificial Sequence: Synthetic probe

<400> SEQUENCE: 1

```
ccctttttgt cccccaactt gagatgtatg aaggcttttg gtctccctgg gagtgggtgg      60
aggcagccag ggcttacctg tacactgact tgagaccagt tgaataaaag tgcacacctt     120
a                                                                     121
```

The invention claimed is:

1. A process for producing a fine metal structure having a surface furnished with microprojections having a thickness or equivalent diameter ranging from 10 nanometers to 10 micrometers and a ratio of a height (H) of the microprojections to the equivalent diameter (D), H/D, being greater than 1, comprising the steps of:
providing a substrate having a surface, a fine rugged pattern formed on the substrate surface;
applying a molecular electroless plating catalyst having atoms dissolved in a solution, in a state of a complex or a salt, to the substrate surface;
forming a catalyst layer with catalyst molecules being absorbed on the substrate surface;
thereafter carrying out electroless plating to form a metal layer filling the fine rugged pattern;
forming a support layer on a surface on a backside of the metal layer; and
detaching the metal layer from the substrate to obtain the fine metal structure furnished with a surface having undergone reversal transfer of the rugged pattern.

2. The process of claim 1, further comprising a step of forming at least one coating layer on the surface of the fine metal structure, the at least one coating layer composed of a different composition from that of the fine metal structure.

3. The process of claim 2, further comprising a step of fixing at least one organic material selected from the group consisting of antigens, antibodies, proteins, bases, sugar chains and surface modifiers at, at least a part of, a surface of the at least one coating layer.

4. The process of claim 2, wherein a coating layer is composed of gold.

5. The process of claim 4, further comprising a step of fixing at least one organic material selected from the group consisting of antigens, antibodies, proteins, bases, sugar chains and surface modifiers at at least a part of a surface of the at least one coating layer.

6. The process of claim 2, wherein a coating layer is composed of silver.

7. The process of claim 2, wherein a coating layer is composed of a platinum group metal.

8. The process of claim 1, wherein the microprojections comprise cylindrical microprojections.

9. The process of claim 1, wherein the microprojections comprise rectangular column microprojections.

* * * * *

UNITED STATES PATENT AND TRADEMARK OFFICE
CERTIFICATE OF CORRECTION

| | |
|---|---|
| PATENT NO. | : 8,741,380 B2 |
| APPLICATION NO. | : 12/859802 |
| DATED | : June 3, 2014 |
| INVENTOR(S) | : Yoshida et al. |

It is certified that error appears in the above-identified patent and that said Letters Patent is hereby corrected as shown below:

Title Page, item (63): delete "Continuation" and insert --Divisional--.

Signed and Sealed this
Thirtieth Day of September, 2014

Michelle K. Lee
*Deputy Director of the United States Patent and Trademark Office*